United States Patent
Ng et al.

(10) Patent No.: US 8,158,973 B2
(45) Date of Patent: Apr. 17, 2012

(54) ORGANIC MEMORY ARRAY WITH FERROELECTRIC FIELD-EFFECT TRANSISTOR PIXELS

(75) Inventors: Tse Nga Ng, Mountain View, CA (US);
Ana C. Arias, Los Gatos, CA (US);
Sanjiv Sambandan, Sunnyvale, CA (US); Robert A. Street, Palo Alto, CA (US); Jurgen H. Daniel, San Francisco, CA (US)

(73) Assignee: Palo Alto Research Center Incorporated, Palo Alto, CA (US)

(*) Notice: Subject to any disclaimer, the term of this patent is extended or adjusted under 35 U.S.C. 154(b) by 297 days.

(21) Appl. No.: 12/607,890

(22) Filed: Oct. 28, 2009

(65) Prior Publication Data

US 2011/0095272 A1   Apr. 28, 2011

(51) Int. Cl.
  *H01L 51/10* (2006.01)
(52) U.S. Cl. .................. 257/40; 257/295; 257/E51.006
(58) Field of Classification Search .............. 257/40, 257/E51.001–E51.052, 295; 438/99
See application file for complete search history.

(56) References Cited

U.S. PATENT DOCUMENTS

| | | | | |
|---|---|---|---|---|
| 6,744,087 | B2 * | 6/2004 | Misewich et al. ............. | 257/295 |
| 6,812,509 | B2 * | 11/2004 | Xu ................................ | 257/295 |
| 7,115,897 | B2 * | 10/2006 | Schmid et al. ................ | 257/40 |
| 7,993,959 | B2 * | 8/2011 | Katz et al. ..................... | 438/99 |
| 2007/0040170 | A1 * | 2/2007 | Cain et al. ..................... | 257/57 |
| 2010/0243994 | A1 * | 9/2010 | Yoon et al. .................... | 257/40 |

OTHER PUBLICATIONS

Katz, H.E., et al. "Organic Field-Effect Transistors with Polarizable Gate Insulators." J. Appl. Phys., vol. 91, No. 3 (Feb. 1, 2002): pp. 1572-1576.*

Nguyen, C.A. et al. "Investigation of Turn-On Voltage Shift in Organic Ferroelectric Transistor with High Polarity Gate Dielectric." Org. Elect., vol. 8 (2007): pp. 415-422.*

Sekitani, T., et al. "Printed Nonvolatile Memory for a Sheet-Type Communication System." IEEE Trans. Elect. Dev., vol. 56, No. 5 (May 2009): pp. 1027-1035.*

Naber et al.: "High-Performance Solution-Processed Polymer Ferroelectric Field-Effect Transistors", nature materials, vol. 4, Mar. 2005, www.nature.com/naturematerials, 2008 Nature Publishing Group, pp. 243-248.

Scott et al.: "Nonvolatile Memory Elements Based on Organic Materials", Wiley InterScience, 2007 Wiley-VCH Verlag GmbH & Co. KGaA, Weinheim, Adv. Mater. 2007, 19, pp. 1452-1463.

Ng, Tse Nga et al. "Degradation mechanisms of organic ferroelectric field-effect transistors used as nonvolatile memory," Journal of Applied Physics 106, 094504 (2009), 5 pages.

Ng, Tse Nga et al. "Organic inkjet-patterned memory array based on ferroelectric field-effect transistors," Organic Electronics 12 (2011), pp. 2012-2018.

* cited by examiner

*Primary Examiner* — Matthew W Such
(74) *Attorney, Agent, or Firm* — Bever, Hoffman & Harms, LLP; Patrick T. Bever

(57) ABSTRACT

An organic non-volatile memory array including multiple pixels and associated signal lines that are disposed on and between a substrate, a single ferroelectric dielectric layer, and a single organic dielectric layer, where each pixel includes a ferroelectric field-effect transistor (FeFET) and at least one organic thin-film field effect transistor (FET) that are connected to associated signal lines in a way that facilitates addressable reading and writing to the FeFET of a selected pixel without disturbing the data stored in adjacent pixels. Analog data storage in the FeFET array is also introduced that does not require analog-to-digital conversion of the stored data.

19 Claims, 12 Drawing Sheets

ORGANIC MEMORY ARRAY WITH FERROELECTRIC FIELD-EFFECT TRANSISTOR PIXELS

This invention was made with Government support under contract W81XWH-08-C-0065 DARPA-SENSOR TAPE. This contract began on Mar. 10, 2008. The Government has certain rights in this invention. Further, the present invention relates to organic electronic devices, more particularly to non-volatile memory arrays for organic electronic devices and to methods for fabricating such devices.

FIELD OF THE INVENTION

Background of the Invention

Semiconductor memories are configured as either read-only memories (ROM) such as EPROM (Electrically Programmable ROM), EEPROM (Electrically Erasable ROM), flash ROM or as volatile, random access memories (RAM) such as SRAM (Static RAM) and DRAM (Dynamic RAM). The processing required to produce these memory types are complicated and the necessary facilities are expensive due to the high temperature processing required. Ferroelectric ceramic random access memories and field effect transistor memories can be configured to be both read-write and non-volatile, but again the processing conditions require processing at temperatures in excess of about 600° C. Furthermore, these silicon-based or ferroelectric ceramic-based memories are expensive as the inorganic raw materials used are expensive when compared to many organic materials in addition to the high costs involved in the processing.

Ferroelectric materials possess the unique properties of a spontaneous polarization which can be re-oriented with an applied field, and that the polarization state can be retained even after the removal of electric field. Hence ferroelectric materials can contain two data states ("+" and "−" polarization states) which are very stable over a variety of environmental conditions. These properties allow ferroelectric materials to be one of the best materials for production of digital computer memories. Research activities on ferroelectric-based computer memories commenced in the 1950s, just following the appearance of computers. However, because these early researches focused on using bulk ferroelectric materials which required very high applied voltages to be used to re-orient the polarization, the research activities were discontinued and no commercial products developed.

In the 1980s, with the advances of ferroelectric thin film deposition technology and integration of ferroelectric thin films with silicon microelectronics, practical ferroelectric memories were developed and commercial products were introduced in the market. These advances allowed for the manufacture of ferroelectric thin film based memories which use a standard 5V or 3V voltage to re-orient the polarization or that is, to read and write data. These ferroelectric random access memories (FRAM) combine the advantages of read-on memories (ROM) and volatile random access memories. FRAM have the same advantages of DRAM and SRAM in that they are easy to write, but are superior to DRAM and SRAM due to their nonvolatility. That is, FRAM store the data even in the absence of power. FRAM also have the same advantages of EPROM, EEPROM and Flash ROM in that they are easy to read, but are superior to EPROM and EEPROM as the write speed of FRAM is much faster than that of EPROM, EEPROM and Flash ROM as well as having a higher number of allowed write cycles. However, FRAM does have one major drawback: FRAMs exhibit destructive readout. That is, in order to determine if the polarization of the ferroelectric thin film cell is positive (e.g., representing a "0") or negative (e.g., representing a "1"), a positive (or a negative) pulse is applied to the cell. The induced charge will be significantly different between positively and negatively polarized ferroelectric cells. However, if the original state of the ferroelectric cell was a negative polarization state, it will change to positive polarization state after reading via a positive pulse being applied to the cell. Likewise, if the original state of the ferroelectric cell was a positive polarization state, it will change to negative polarization state after reading via a negative pulse being applied to the cell. This destructive readout requires that each read access be accompanied by a pre-charge operation to restore the memory state.

In order to solve the destructive readout problem, ferroelectric thin film-based field effect transistors (FETs) have been proposed as the next-generation ferroelectric memories. The ferroelectric FETs use a ferroelectric thin film as a gate dielectric. The ferroelectric thin film is deposited on a silicon substrate, either with or without a thin dielectric layer such as silicon dioxide ($SiO_2$) or silicon nitride ($Si_3N_4$) between the silicon substrate and the ferroelectric thin film. When a gate voltage is applied, the polarization of the ferroelectric thin film can be either positive or negative and the polarization state can be retained after the removal of gate voltage. This positive or negative polarization can affect the source-drain current or the source-drain resistance. As the source-drain current or resistance can be controlled by the polarization state of the ferroelectric thin film, a single ferroelectric FET can be used as a memory cell. It can be seen that the ferroelectric FET memory cells have all the advantages of FRAM, such as nonvolatility, easy to read and write, lower power consumption, plus the additional advantage of a nondestructive readout. Furthermore, FRAMs utilizing ferroelectric thin films have a larger remnant polarization (usually larger than 10 $\mu C/cm^2$), while a remnant polarization of at the order of one-tenth $\mu C/cm^2$ can effectively change the source-drain current in ferroelectric FET memories.

Until recently, all ferroelectric FET memory cells used ferroelectric ceramic thin films such as lead zirconate titanate (PZT) or strontium bismuth tantalate ($SrBi_2Ta_2O_9$ or SBT) with Si-based semiconductors. Therefore, both to deposit the ferroelectric film and to make the FET requires high temperature processes with temperatures in excess of about 600° C. A research group in France has demonstrated (G. Velu, C. Legrand, O. Tharaud, A. Chapoton, D. Remiens, and G. Horowitz, Appl. Phys. Lett, 79, 659, 2001) the memory effect of a ferroelectric FET using PZT thin film as gate dielectric and α6T (sexithiophene) organic thin film transistor. The deposition of α6T organic thin film can be done at 100° C., but the preparation of PZT film needs a post annealing treatment at 625° C.

In contrast to ferroelectric ceramic thin films, ferroelectric polymer thin films, such as in the family of poly(vinyidiene-trifluoroethylene) (P(VDF-TrFE)) copolymers can be easily deposited on silicon or other substrates using solution spin coating, casting, evaporation or Langmuir-Blodgett (LB) growth method, with the growth temperature lower than 200° C. The remnant polarization of these polymer thin films can be higher than 40 $mC/m^2$, or 4 $\mu C/cm^2$, which is large enough to change the source-drain current and suitable for use in a ferroelectric memory device. Thus organic, nonvolatile, nondestructive readout ferroelectric memory cells can be developed by combining ferroelectric polymer thin film technology and organic thin film transistor technology.

U.S. Pat. No. 6,812,509 (Xu) discloses organic ferroelectric memory cells having field effect organic transistors that are formed using a ferroelectric thin film polymer as the gate dielectric. Xu teaches that by controlling the gate voltage to polarize the thin film ferroelectric polymer polarized in either an "up" or "down" state, the source-drain current can be controlled between two different values under the same source-drain voltage. The source-drain current thus can be used to represent either a "0" or "1" state. Xu teaches using various organic thin films and ferroelectric thin films to form his cells. As the deposition of these organic thin films can be done at temperatures below 200° C., the memory cells can be made on many kinds of substrates including plastics.

Although Xu teaches structures associated with individual cells, Xu does not address the arrangement of cells to form an array of memory cells that can be used in organic electronic devices to store large amounts of data. Thus, what is needed is a memory array including FeFET-based pixels (cells) that can be formed using low cost organic electronic fabrication techniques for applications such as radio frequency identification (RFID) devices and integrated sensor data logger devices, in which read and write operations directed to selected pixels do not disturb data stored in surrounding pixels.

SUMMARY OF THE INVENTION

The present invention is directed to a non-volatile memory array in multiple pixels and associated signal lines are disposed on and between a substrate, a single organic dielectric layer, and a single ferroelectric dielectric layer, wherein each of the pixels includes a ferroelectric field-effect transistor FeFET and at least one organic thin-film field effect transistor (FET) that are connected to associated signal lines in a way that facilitates addressable reading and writing to the FeFET of each pixel without disturbing the data stored in adjacent pixels. By forming the array utilizing only two (i.e., ferroelectric and organic) dielectric layers and utilizing well-established low cost organic electronic fabrication methods (e.g., ink jet printing), the present invention facilitates the production of low cost, low voltage organic electronic devices such as radio frequency identification (RFID) devices and integrated sensor data logger devices that require large amounts of memory.

According to an embodiment of the present invention, 2T pixels are disclosed in which an organic "write" FET is utilized to selectively pass write pulse signals to the gate electrode of the pixel's FeFET, thereby polarizing the ferroelectric material disposed in the channel of the FeFET in order to store data. Subsequent read operations are performed by supplying a read current to the source of the FeFET, and measuring the source-drain current passing through the FeFET. To isolate the selected FeFET, the read current is supplied on a "row" signal line, and the source-drain current is transmitted on a "column" signal line that is orthogonal to the row signal line. Various disclosed alternative embodiments utilize ink jet printed electrode and semiconductor structures disposed between the substrate, the ferroelectric dielectric material layer and the organic dielectric material layer to form the desired 2T structures.

According to another embodiment of the present invention, 3T pixels are disclosed in which both an organic "write" FET and an organic "read" FET is utilized to selectively write and read data stored on the pixel's FeFET. Read operations are performed by supplying a read current on a row signal line to the source of a selected FeFET by turning on that pixel's read FET, and measuring the resulting source-drain current on the row signal line. To isolate other (non-selected) FeFETs coupled to the row signal line, the read FETs associated with the non-selected pixels are turned off. Various disclosed alternative embodiments utilize ink jet printed electrode and semiconductor structures disposed between the substrate, the ferroelectric dielectric material layer and the organic dielectric material layer to form the desired 3T structures.

According to another embodiment of the present invention, the disclosed memory arrays are utilized to store analog data without using analog-to-digital circuits to store different values of input voltage, thereby facilitating the production of low-cost organic electronic devices.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in organic electronics. The following description is presented to enable one of ordinary skill in the art to make and use the invention as provided in the context of a particular application and its requirements. As used herein, directional terms such as "upper", "upwards", "lower", "downward", "front", "rear", are intended to provide relative positions for purposes of description, and are not intended to designate an absolute frame of reference. The terms "coupled" and "connected", which are utilized herein, are defined as follows. The terms "connected" and "electrically connected" is used to describe a direct connection between two circuit elements, for example, by way of a metal line or via structure foamed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
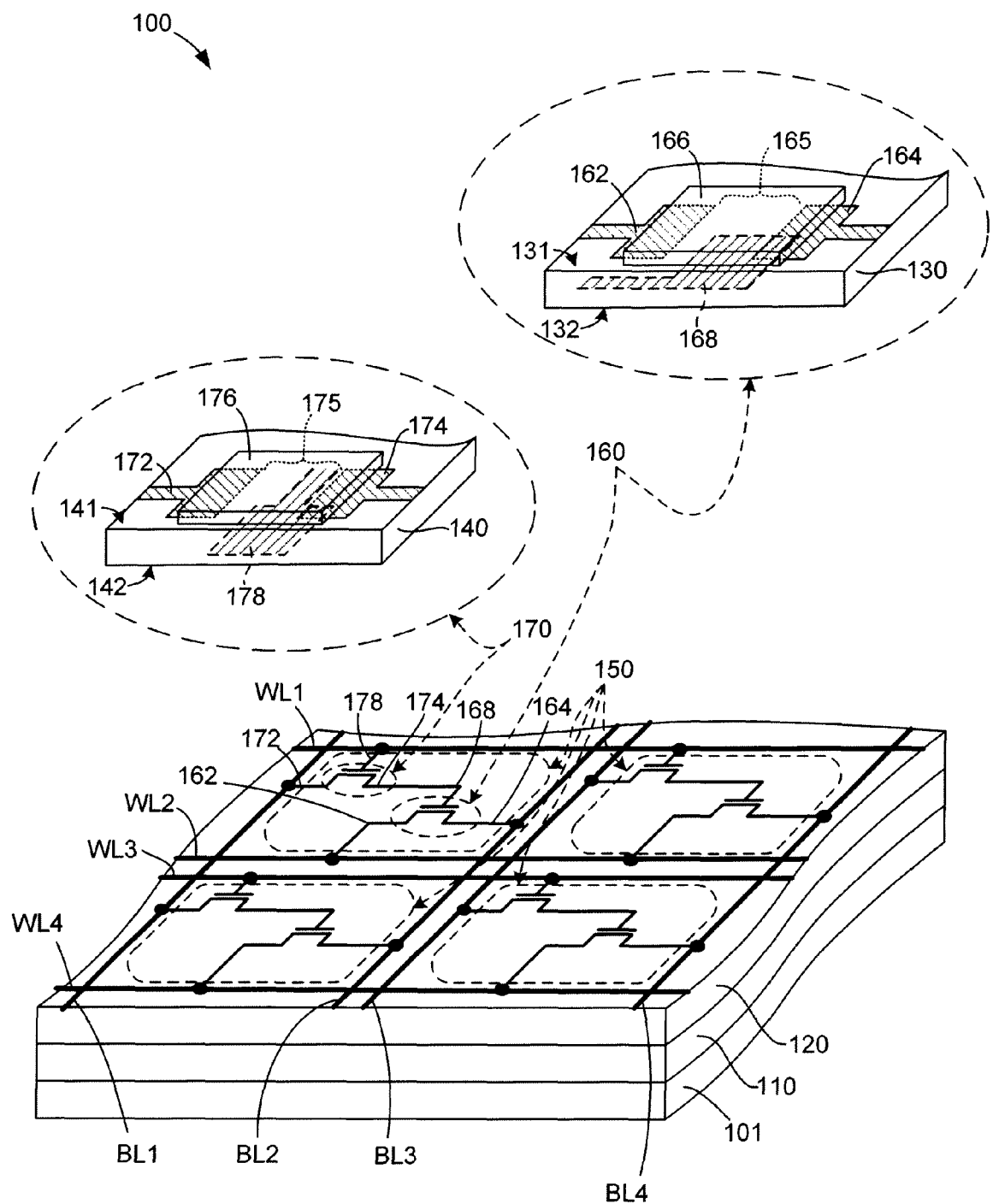
FIG. 1 is a partial simplified diagram depicting an organic memory array according to an embodiment of the present invention.

FIG. 1 is a simplified diagram depicting a portion of a generalized organic memory array 100 that is formed in accordance with an embodiment of the present invention. Memory array 100 is formed on a substrate 101, and generally includes a first dielectric layer 110 disposed on the substrate, and a second dielectric layer 120 disposed on the first dielectric layer, and multiple memory pixels 150 (four shown) and associated control and interconnect structures that are formed by metal electrode and line structures and semiconductor structures, which are described in additional detail below.

According to an aspect of the invention, one of dielectric layers 110 and 120 consists entirely of a ferroelectric dielectric material, and the other of dielectric layers 110 and 120 consists entirely of an organic dielectric material. Both dielectric layer 110 and 120 are formed on using low cost blanket deposition techniques such that each layer forms a substantially continuous sheet over the entirety of substrate 101. As set forth in the specific examples described below, the various TFT and interconnect structures introduced in FIG. 1 are formed on or between the various material layers, and the order in which the ferroelectric and organic dielectric layers are deposited may be reversed. For example, in one set of embodiments below, first dielectric layer 110 consists of a ferroelectric dielectric material layer that is formed on an upper surface of substrate 101, and second dielectric layer 120 consists of an organic dielectric material layer that is formed on an upper surface of first dielectric layer 110. In other embodiments, first dielectric layer 110 consists of an organic dielectric material layer that is formed on an upper surface of substrate 101, and second dielectric layer 120 consists of a ferroelectric dielectric material layer that is formed on an upper surface of first dielectric layer 110.

According to an embodiment of the present invention, substrate 101 of organic memory array 100 consists of flexible polymer foil such as polycarbonate, poly(ethylene terephthalate), polyimide, and poly(ethylene naphthalate), or rigid glass having thickness in the range of 100 micron to 800 micron. Alternatively, silicon wafers and silicon oxide grown on silicon wafers have been widely used as substrates and gate dielectric to make organic thin film FETs. Organic thin film FETs have also been built using gate dielectrics such as parylene, polyimide, polyvinyl alcohol (PVA), polyvinyl chloride (PVC), and polymethylmethacrylate (PMMA) as described in X. Peng, G. Horowitz, D. Fichiou, and F. Garnier, Appl. Phys. Lett., 57, 2013, 1990; Z. Bao, Y. Fang, A. Dodabalapur, V. R. Raju, and A. J. Lovinger, Chem. Mater., 9, 1299, 1997.

According to an embodiment of the present invention, the ferroelectric dielectric material layer of organic memory array 100 consists of poly(vinyidene-trifluoroethylene) (P(VDF-TrFE)) copolymers having thickness in the range of 50 nm to 1000 nm. Alternatively, several candidate ferroelectric polymer materials can be used, including but not limited to poly(vinylidene fluoride) (PVDF), odd-numbered nylons, cyanopolymers, polyureas and polythioureas. Thin films of these polymers can be produced by solution spin coating or solution casting, Langmuir-Blodgett (LB) monolayer growth method, and vapor deposition polymerization process. Typically these deposition processes can be done below 200° C. A typical process to produce P(VDF-TrFE) copolymer thin films by solution spin coating method has been described in Q. M. Zhang, H. Xu, F. Fang, Z. Y. Cheng, F. Xia, and H. You, J. Appl. Phys., 89, 2613, 2001. The steps in this typical process include first dissolving P(VDF-TrFE) copolymers in the composition range from 50/50 to 80/20 mol % in dimethylformide (DMF) or 2-butanone, with a resulting concentration ranging from 4 wt % to 12 wt %. Then the solution is used in a spin coating process to provide a film. It is well known in the art that films with various thicknesses can be obtained by controlling the spin conditions and/or using a process which uses multiple coating procedure. Finally the films are annealed at 140° C. under vacuum to remove the residual solvent and to improve the crystallization. This process can obtain films with a thickness between 50 nm to more than 1 μm and remnant polarization of more than 40 mC/m$^2$. An alternative process uses the Langmuir-Blodgett deposition method to obtain P(VDF-TrFE) 70/30 copolymer films, with thickness of 5000 angstroms to 5 μm.

According to an embodiment of the present invention, the semiconductors of organic memory array 100 consists of a polythiophene polymer and a polymer blend (e.g., PQT, Flexink) having thickness in the range of 5 nm to approximately 200 nm. There are several alternative organic semiconductor thin film materials that can be used in memory array 100, including but are not restricted to poly(phenylenes), thiophene oligomers, pentacene, and perfluoro copper phthalocyanine, perylene. While a wide variety of organic semiconductor thin films materials are suitable, it is believed that those materials with high mobility or high current modulation $I_{on}/I_{off}$ are preferred as the source-drain current of such materials is more sensitive to an applied gate voltage. It is believed that the higher sensitivity to an applied gate voltage will result in improved read/write characteristics. The thickness of the organic semiconductor thin films can be in the range of approximately 5 nm to approximately 200 nm, with preferably a thickness of approximately 50 nm.

Referring again to FIG. 1, according to an aspect of the present invention, each pixel 150 includes a ferroelectric field effect transistor (FeFET) 160 and an organic thin-film field effect transistor (organic FET) 170 that are connected to associated signal lines WL1-WL4 and BL1-BL4. FeFET 160, organic FET 170 and signal lines WL1-WL4 and BL1-BL4 are formed by thin film structures (e.g., metal and/or organic semiconductor) that are deposited by ink jet or other printing techniques on one of substrate 101 and layers 110 and 120 using known techniques, thereby minimizing manufacturing costs.

As indicated on layer 120 of FIG. 1, ferroelectric field effect transistor (FeFET) 160 includes a (first) source electrode 162 connected to signal line WL2, a (first) drain electrode 164 connected to signal line BL2, and a (first) gate electrode 168. As indicated in the partial perspective diagram at the upper right of FIG. 1, FeFET 160 is formed on ferroelectric dielectric material layer 130, which makes up one of dielectric layer 110 and 120 (shown in the structure shown at the bottom of FIG. 1). Source electrode 162 and drain electrode 164 are formed by separate thin film metal structures that are printed onto a first (e.g., upper) surface 131 of ferroelectric dielectric material layer 130, and gate electrode 168 is formed by another thin film metal structures that is disposed on a second (e.g., lower) surface 132 of ferroelectric dielectric material layer 130 (i.e., gate electrode 168 is either printed onto surface 132, or is printed onto substrate 101 when ferroelectric dielectric material layer 130 is implemented as first dielectric layer 110, or printed onto first dielectric layer 110 when ferroelectric dielectric material layer 130 is implemented as second dielectric layer 120). Source electrode 162 and drain electrode 164 are separated by a gap, and a portion of ferroelectric dielectric layer 130 disposed under this gap defines a (first) channel region 165 of FeFET 160. A (first) organic semiconductor portion 166 is disposed on surface 131 over channel region 165, and gate electrode 168 is disposed on surface 132 below channel region 165. Note that the structure depicted in FIG. 1 may be reversed such that "upper" surface 131 faces substrate 101, and "lower" surface 132 faces away from substrate 101, whereby gate electrode 168 is disposed over organic semiconductor portion 166.

Referring again to the lower part of FIG. 1, organic FET 170 includes a (second) source electrode 172 connected to signal line BL1, a (second) drain electrode 174 connected to source region 162 of FeFET 160, and a (second) gate electrode 178 that is connected to signal line WL1. As indicated in the partial perspective diagram at the upper left portion of FIG. 1, organic FET 170 is formed on organic dielectric material layer 140, which is implemented by one of dielectric layers 110 and 120. Source electrode 172 and drain electrode 174 are formed by separate thin film metal structures that are printed onto a first (e.g., upper) surface 141 of organic dielectric material layer 140, and gate electrode 178 is formed by another thin film metal structures that is disposed on a second surface 142 of organic dielectric material layer 130. Source electrode 172 and drain electrode 174 are separated by a gap, and a portion of organic dielectric layer 140 disposed under this gap defines a (second) channel region 175 of organic FET 170. A (second) organic semiconductor portion 176 is disposed on surface 141 over channel region 175, and gate electrode 178 is disposed below channel region 175. Note that the structure depicted in FIG. 1 may be reversed.

The various electrodes (e.g., source electrodes 162 and 172) and signal lines associated with memory array 100 are preferably formed by printing silver ink using an ink jet printer according to known techniques. However, in alternative embodiments, these conductive structures may be formed by evaporated or sputtered metal electrodes such as gold, platinum, or aluminum, evaporated or printed conducting oxides such as Indium-Tin oxide (ITO) and conducting polymers such as polyaniline have been used as electrodes for organic thin film FETs as described in Z. Bao, Y. Fang, A. Dodabalapur, V. R. Raju, and A. J. Lovinger, Chem. Mater., 9, 1299, 1997; G. Gustagsson, Y. Cao, G. M. Treacy, F. Klavetter, N. Colaneri, and A. J. Heeger, Nature, 357, 277, 1992. It has also been reported that conducting polymer electrodes can improve the performance of ferroelectric P(VDF-TrFE) thin films by Z. Y. Cheng, H. S. Xu, J. Su, Q. M. Zhang, P. C. Wang, and A. G. MacDiarmid, Proc. SPIE, 3669, 140, 1999.

In a preferred embodiment, organic thin film semiconductor portions 166 and 176 comprise of polythiophene PQT or polymer blend such as Flexink that is printed using low-cost ink jet printing techniques according to known techniques. Alternatively, semiconductor portions 166 and 176 can be made by well known processes such as vacuum evaporation, electrochemical polymerization, solution spin coating, screen printing, and Langmuir-Blodgett growth. For example, pentacene thin films can be produced by using vapor deposition with the substrate temperatures from room temperature to 120° C. as described in C. D. Dimitrakopoulos, B. K. Furman, T. Graham, S. Hegde, and S. Purushothaman, Synth. Met., 92, 47, 1998, or by solution spin coating method using dichloromethane as solvent and annealing temperatures of 140 to 180° C. as described in A. R. Brown, A. Pomp, D. M. de Leeuw, D. B. M. Klaassen, E. E. Having a, P. Herwig, and K. Mullen, J. Appl. Phys., 79, 2136, 1996.

According to the present invention, pixels 150 of array 100 are connected to control circuits (not shown in FIG. 1, but are discussed below) by way of signal lines WL1-WL4 and BL1-BL4 such that a selected FeFET 160 can be selected for "write" or "read" memory operations by transmitting appropriate signals on selected ones of signal lines WL1-WL4 and BL1-BL4. Note that signal lines WL1-WL4 and BL1-BL4 are made up of parallel word lines WL1-WL4 and parallel bit lines BL1-BL4. Signal lines WL1-WL4 are formed on different layers from signal lines BL1-BL4 to facilitate aligning bit lines BL1-BL4 orthogonal to word lines WL1-WL4 without generating a short circuit.

Figure 2:
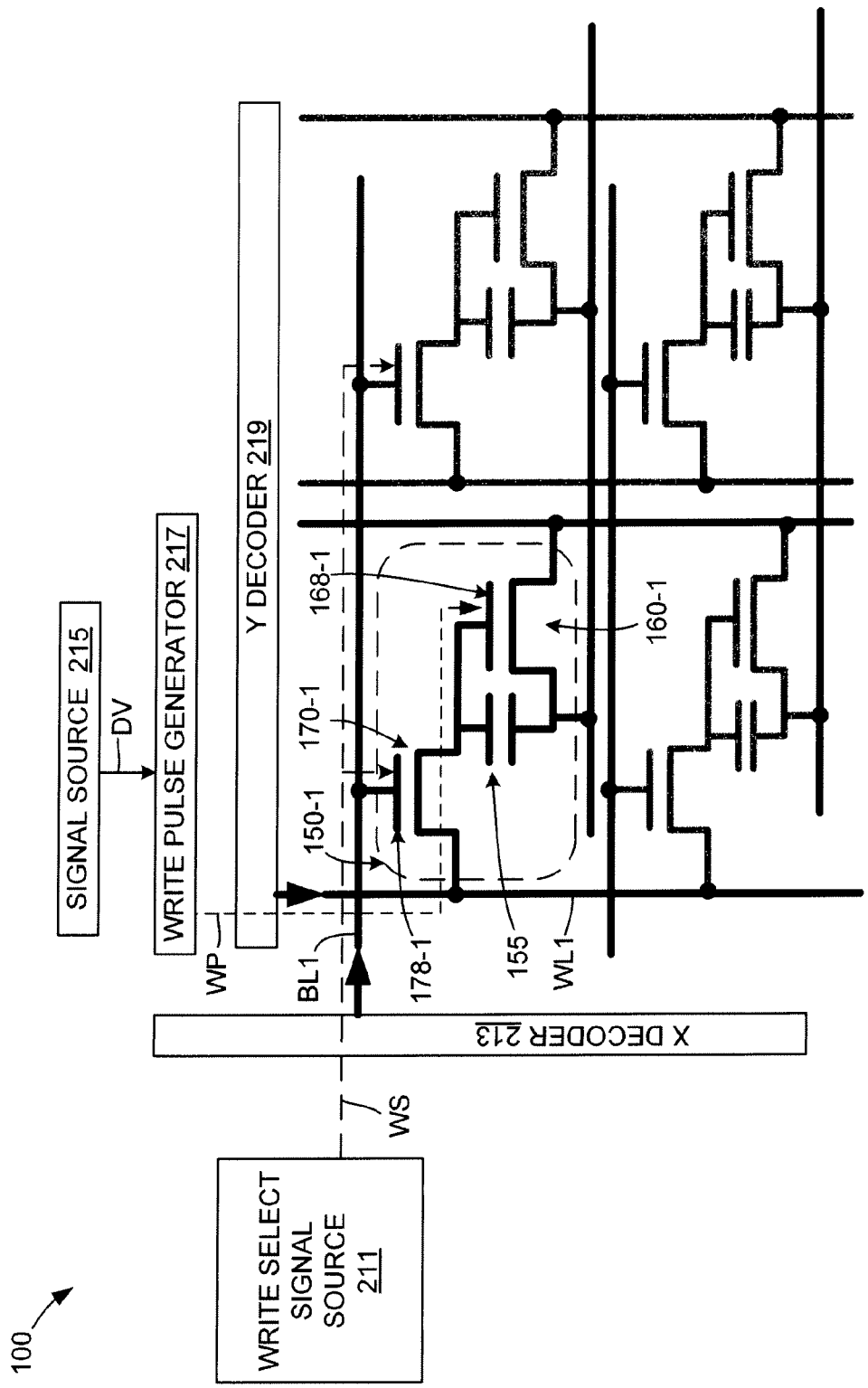
FIG. 2 is simplified circuit diagram showing the organic memory array of FIG. 1 in additional detail during a write operation.

FIG. 2 is a simplified circuit diagram showing a portion of organic memory array 100 utilized to write a predetermined data value DV to a selected FeFET 160-1 of a selected pixel 150-1. As indicated in FIG. 2, selected FeFET 160-1 is addressed by transmitting a write select signal WS generated by a source 211 onto bit signal line BL1 by way of a decoder circuit 213, whereby write select signal WS is applied to gate electrode 178-1, thereby turning on organic FET 160-1 to couple signal line WL1 to gate terminal 168-1 of selected FeFET 160-1. At the same time a data value DV is generated by a signal source (e.g., a sensor) 215 that is passed to a write pulse generator 217 by a controller (not shown), which generates a corresponding write pulse signal WP that is transmitted onto signal line WL1 by way of a decoder 219. With organic FET 170-1 turned on, write pulse signal WP is passed from signal line WP1 to gate terminal 168-1 of selected FeFET 160-1, whereby an electric field generated by gate electrode 168-1 in response to write pulse signal WP generates a corresponding change in the polarization of a portion of the ferroelectric dielectric material layer disposed between gate electrode 168-1 and the channel region of selected pixel 150-1. By changing the dielectric polarization, the transistor threshold voltage associated with FeFET 160-1 is shifted, and the source-drain current of FeFET 160-1 is increased ("on" state) or decreased ("off" state). An optional capacitor 155 can be added in parallel with the FeFET as indicated in FIG. 2 to increase the dielectric charging time to allow sufficient time for polarization switch. Bilayer dielectrics with a high-k dielectric such as $Ta_2O_5$ can be used to lower the transistor operation range.

Figure 3:
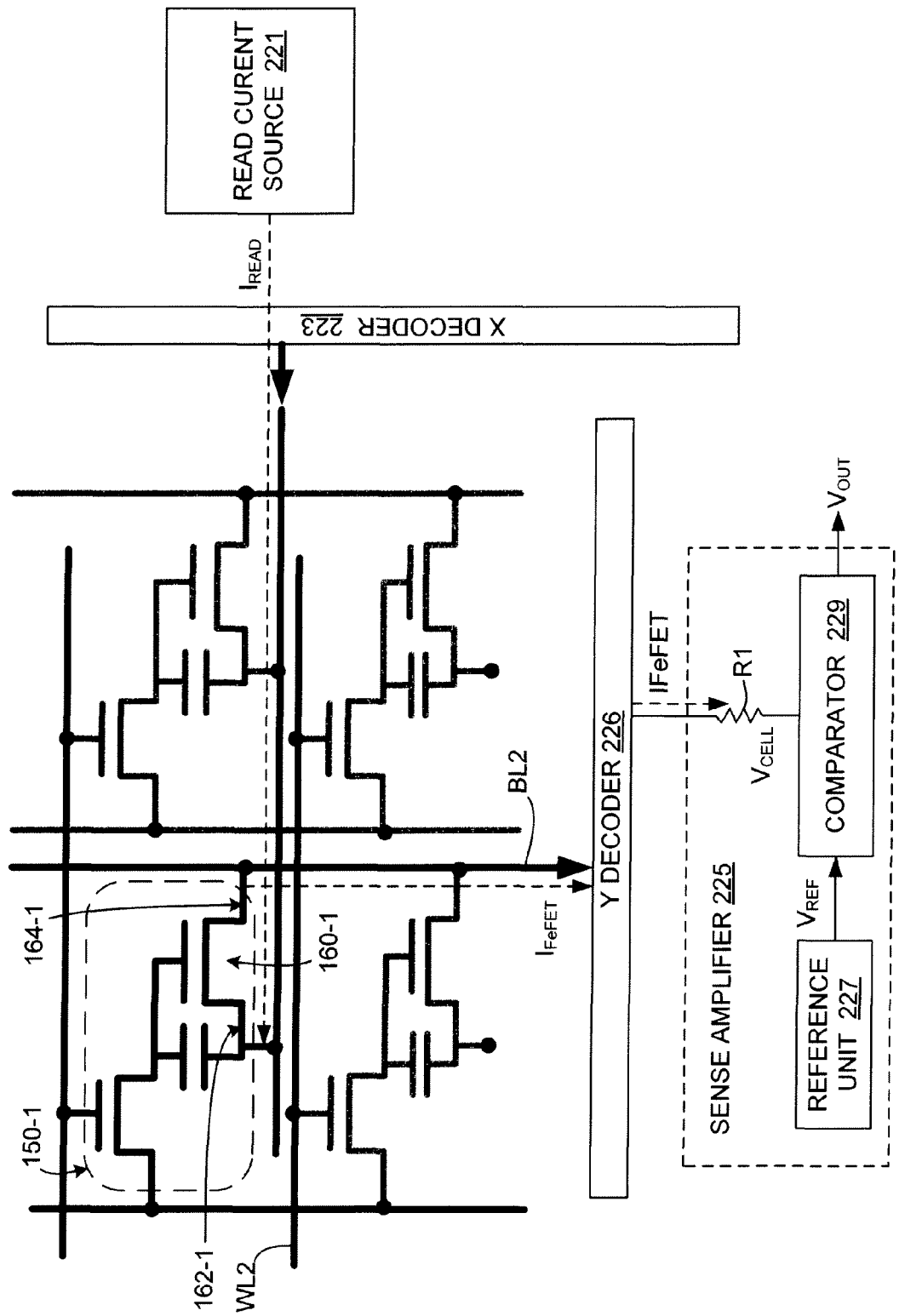
FIG. 3 is simplified circuit diagram showing the organic memory array of FIG. 1 in additional detail during a read operation.
Figure 4:
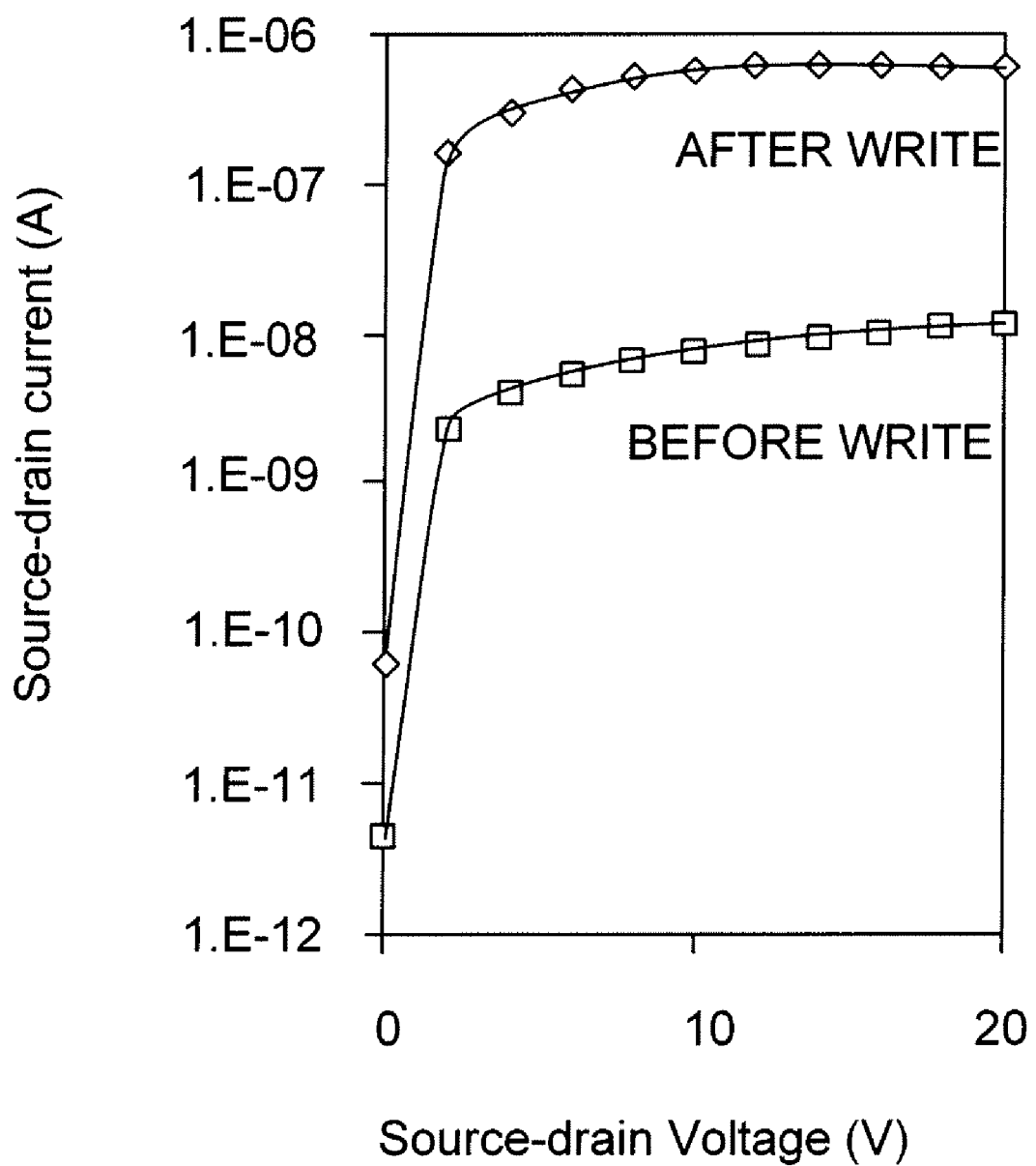
FIG. 4 is a simplified graph showing source-drain current to source-drain voltage comparisons associated with Fe-FET memory cells utilized in the organic memory array of FIG. 1.

FIG. 3 is a simplified circuit diagram showing a portion of organic memory array 100 utilized to read the data value stored in selected FeFET 160-1 of pixel 150-1. As indicated in FIG. 3, selected FeFET 160-1 is addressed by transmitting a read current $I_{READ}$ from a source 221 onto signal line WL2 by way of a decoder circuit 223, whereby the read current $I_{READ}$ is transmitted to source electrode 162-1 of selected FeFET 160-1. At the same time, signal line BL2 is coupled to a sense amplifier 225 or other signal detection circuit by way of a decoder 226. As set forth above, under the conditions depicted in FIG. 3, an amount $I_{FeFET}$ of read current $I_{READ}$ is passed by ferroelectric FET 160-1 to current detection circuit 225, which includes in one example a resistor R1 for converting the current $I_{FeFET}$ to a cell voltage $V_{CELL}$, which is then compared y a comparator 229 with a reference voltage $V_{REF}$ generated by a reference unit 227. The read value from pixel 150-1 is then output as a voltage signal $V_{OUT}$. Thus, in the reading step, the state of selected FeFET 150-1 is determined by measuring its source-drain current. However, a common dataline cannot be used to transmit the $I_{FeFET}$ because the read-out will be a sum of the current from several FeFETs rather than from a single pixel. Further, a gate voltage cannot be applied to turn off the FeFETs not being read, because it will over-write the stored states of these non-selected FeFETs. The solution set forth by the embodiment of FIG. 3 is to use "row" lines to transmit the read current $I_{READ}$ and column lines to read out data values IFeFET. This pixel has been fabricated in practice, and experimentally measured data storage is displayed in FIG. 4. As set forth below, another approach proposed in the embodiments associated with FIGS. 11-14 involves adding a second organic thin-film FET to serve as a read switch that isolates each pixel's FeFET current for read-out.

As set forth above with reference to FIG. 1, one of dielectric layers 110 and 120 includes a ferroelectric dielectric material, and the other of dielectric layers 110 and 120 includes an organic dielectric material. In the specific embodiments described below with references to FIGS. 5-9, an organic dielectric material layer 140 is disposed in the location associated with dielectric layer 110 (i.e., directly on substrate 101), and a ferroelectric dielectric material layer 130 is disposed in the location associated with dielectric layer 120 (i.e., on organic dielectric layer 140). In another exemplary embodiment described below with reference to FIG. 10, the order is reversed and dielectric material layer 130 is disposed between substrate 101 and organic dielectric material layer 140.

Figure 5:
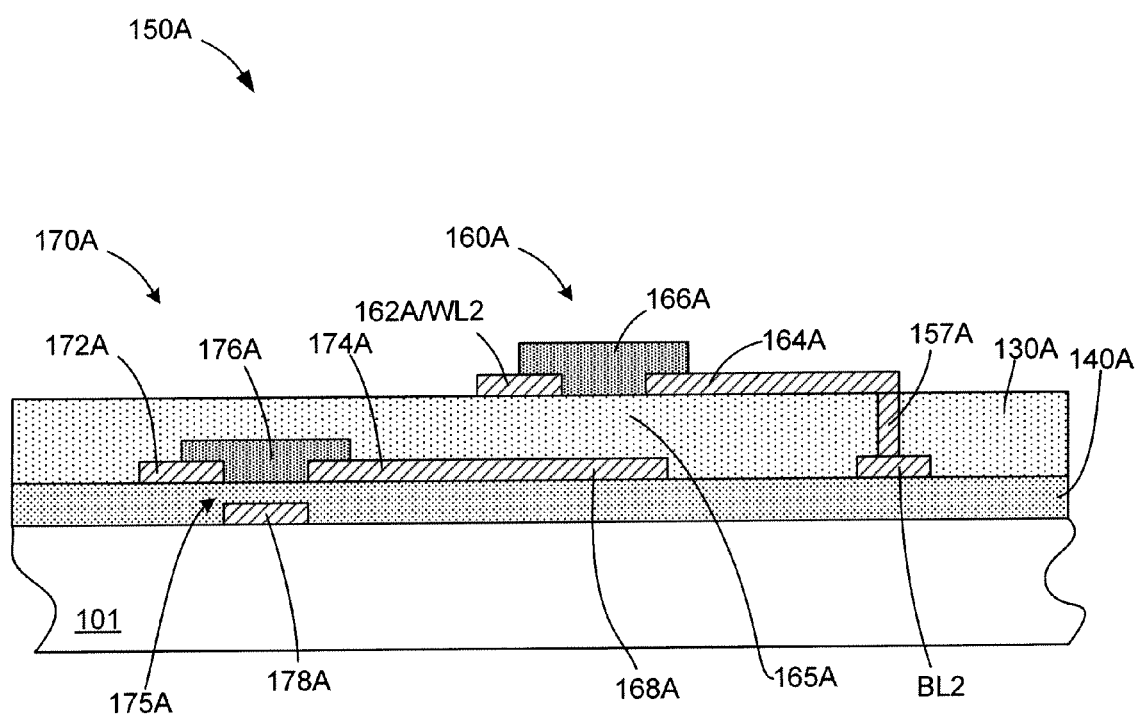
FIG. 5 is a cross-sectional side view showing an exemplary pixel of the organic memory array of FIG. 1 according to a specific embodiment of the present invention.

FIG. 5 is a simplified cross-sectional side view showing a pixel 150A according to a specific embodiment of the present invention including a bottom gate FeFET transistor 160A and a bottom gate write select (organic FET) transistor 170A, wherein pixel 150A is utilized in place of generalized pixel 150 of FIG. 1 to form an organic memory array according to a first specific embodiment of the present invention. Referring to the left side of FIG. 5, organic FET 170A is constructed such that source electrode 172A, drain electrode 174A and organic semiconductor portion 176A are disposed between organic dielectric material layer 140A and ferroelectric dielectric material layer 130A, and gate electrode 178A is disposed between substrate 101 and organic dielectric material layer 140A below channel region 175A. Similarly, FeFET transistor 160A is formed such that gate electrode 168A is disposed between organic dielectric material layer 140A and ferroelectric dielectric material layer 130A below channel region 165A, and source electrode 162A, drain electrode 164A and organic semiconductor portion 166A are disposed on ferroelectric dielectric material layer 130A over drain electrode 168A. According to another aspect of the present embodiment, in order to facilitate disposing orthogonal signal lines WL2 (which is connected to source electrode 162A) and BL2 (which is connected to drain region 164A), pixel 150A further includes a metal via structure 157A that extends through ferroelectric dielectric material layer 130A between drain electrode 164A and signal line BL2, which is disposed between organic dielectric material layer 140A and ferroelectric dielectric material layer 130A. Metal via structure 157A is formed by etching such as printing solvent/etchant to remove material locally or laser ablating a portion of ferroelectric dielectric material layer 130A to form the required via (opening), and then printing a conductive ink material (e.g., a silver-based ink) into the via.

Figure 6:
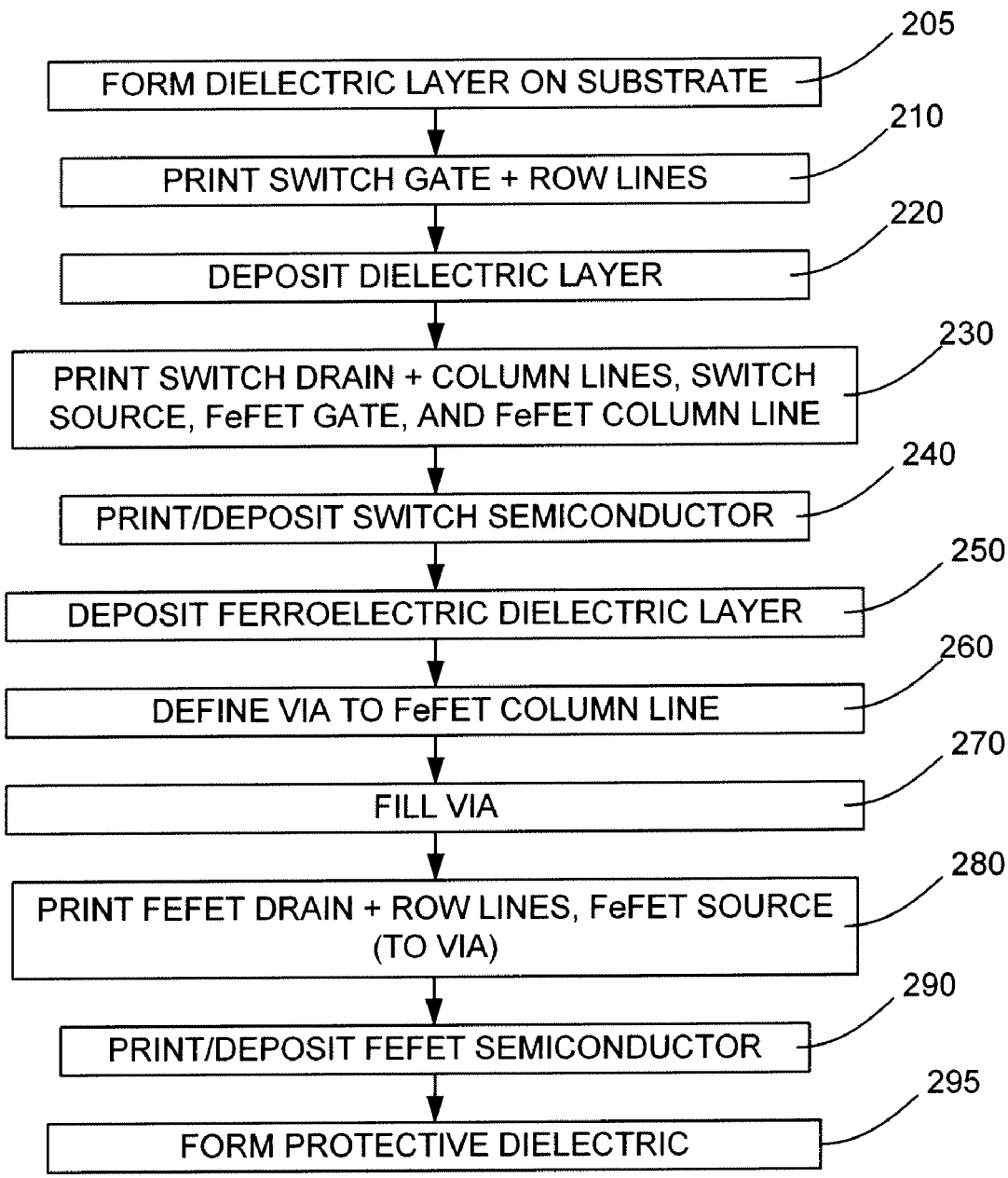
FIG. 6 is a flow diagram showing process steps associated with the fabrication of the exemplary pixel of FIG. 5 according to another specific embodiment of the present invention.

FIG. 6 is a flow diagram listing the sequence of steps associated with the fabrication of memory array 100A according to a specific embodiment of the present invention.

Referring to the top of FIG. 6, after selecting a suitable substrate (e.g., either rigid or flexible and made from one of silicon, metal, glass, plastic, or any other suitable material that can withstand the temperatures of approximately 200° C.), an optional dielectric layer is formed (block 205). If a conducting material is used for the substrate, such as doped silicon substrates or metal substrates, then the substrate should include a thin insulating layer on the upper surface in order to isolate the gate electrodes from the substrate. For instance, a silicon wafer could have a thin layer of oxidization or nitride on the upper surface as an insulator. For a metal substrate, a thin inorganic insulating layer, such silicon oxide or silicon nitride, or a thin organic insulating layer, such as polyimide, may be used. Such thin organic insulating layers may be deposited on the surface by using well known sputtering, chemical vapor deposition, or solution deposition method. The insulating layers described above are for descriptive use only, and other insulating layers may also be used.

Gate electrode 178A and associated wordlines (e.g., wordline WL1) is then preferably formed by printing a silver-based ink using ink-jet printing techniques onto the substrate (block 210). Alternatively, gate electrode 178A and the associate wordlines could be any patterned conductive material such as a metal thin film, for instance gold, platinum, aluminum, or titanium, a conducting oxide such as ITO, or a conducting polymer such as polyaniline, and polypyrrolon the surface of the substrate. The gate electrode could be deposited by the well known methods of evaporation, sputtering, screen printing, solution dip or spin coating depending on which process is most suitable for the electrode, material and substrate being used.

Organic (non-ferroelectric) dielectric material layer 140A is then formed by depositing a poly(p-xylylene) polymer (e.g., Parylene-N™ over the substrate using well known room temperature deposition methods (block 220). Alternative methods for forming organic dielectric material layer 140A include solution casting or spin coating, screen printing or jet printing, Langmuir-Blodgett growth method or self assembly of layers from solution or other methods. Alternative organic dielectric materials include polyimide, polyvinyl alcohol (PVA), fluorinated polymer Cytop, and polymethylmethacrylate (PMMA).

Source electrode 172A (and its associated bitline), drain electrode 174A, gate electrode 168A and bit line BL2 are then preferably formed on organic dielectric layer 140A by printing a silver-based ink using ink-jet printing techniques onto the substrate (block 230). These structures may be produced utilizing the alternative metallization processes described above.

Deposition of organic semiconductor thin film portion 176A in the channel region separating source electrode 172A and drain electrode 174A is then performed by printing polythiophene PQT, polymer blend such as Flexink, or perylene derivatives using ink-jet printing techniques (block 240). Alternative organic semiconductor materials that can be used include poly(phenylenes), thiophene oligomers, pentacene, polythiophene. While the above materials are p-type semiconductors, n-type semiconductors such as perfluoro copper phthalocyanine and perylene derivatives can be used also. In addition, inorganic semiconductors that are printable at low-processing temperature such as zinc oxide are also good alternatives. Alternative methods for forming organic semiconductor thin film portion 176A include deposition by vapor deposition, solution casting or spin coating, screen printing, Langmuir-Blodgett growth method or self assembly of layers from solution.

Deposition of ferroelectric dielectric material layer 130A is then performed (block 250) by depositing P(VDF-TrFE) using spin coating techniques. While ferroelectric polymer materials in the family of copolymers are suitable, other ferroelectric polymer materials such as PVDF, odd-numbered nylons, cyanopolymers, polyureas and polythioureas could also be used. These polymer thin films could be deposited by evaporation, solution casting or spin coating, Langmuir-Blodgett growth method, screen printing or jet printing.

Via 157A is then defined through ferroelectric dielectric material layer 130A (block 260) by forming a via opening using locally printed solvent etchant for PVDF-TrFE and by laser ablation for parylene-N, and then filling the via opening (block 270) using silver-based ink.

Source electrode 162A (and its associated wordline) and drain electrode 164A are then preferably formed on ferroelectric dielectric layer 130A by printing a silver-based ink using ink-jet printing techniques onto the substrate (block 280), followed by the deposition of organic semiconductor thin film portion 166A by printing polythiophene using ink-jet printing techniques (block 290). Alternative methods provided above may be used in place of these processes. Finally, an optional protective dielectric layer (block 295) is formed over ferroelectric dielectric layer 130A according to known techniques.

While the basic processes are described above with specific reference to the fabrication of memory array 100A, there are several optional steps known to those skilled in the art that may be used. In addition, although the basic processes described above are utilized in the fabrication of the alternative embodiments described below, those skilled in the art will recognize the order in which the basic processes are performed may be varied to achieve the desired structures.

Figure 7:
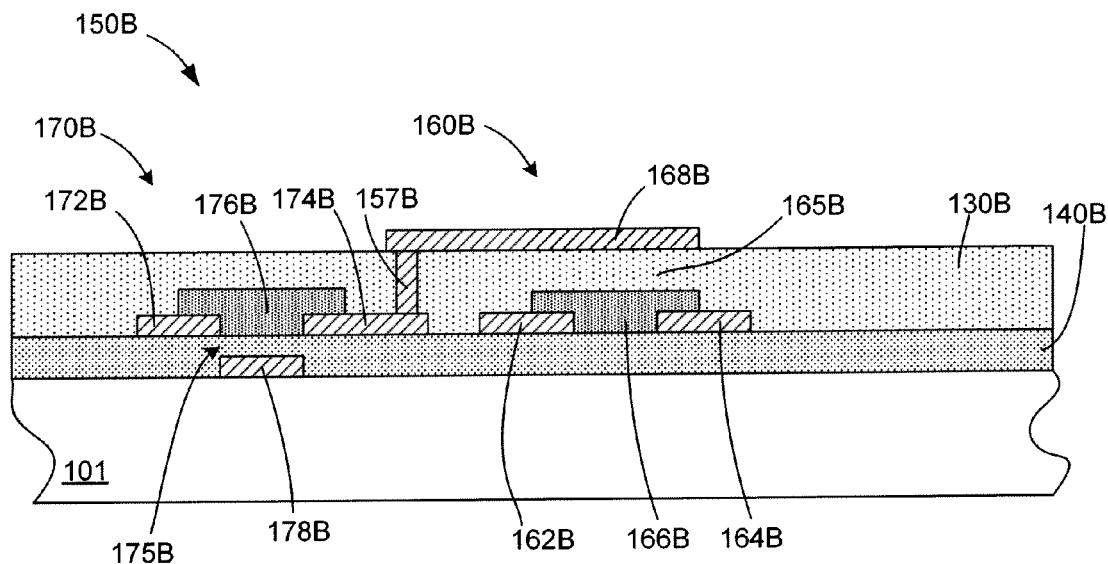
FIG. 7 is a cross-sectional side view showing an exemplary pixel of the organic memory array of FIG. 1 according to another specific embodiment of the present invention.

FIG. 7 is a simplified cross-sectional side view showing a pixel 150B according to an alternative specific embodiment of the present invention including a top gate FeFET transistor 160B and a bottom gate write select (organic FET) transistor 170B, wherein pixel 150B is utilized in place of generalized pixel 150 of FIG. 1 to form an organic memory array according to a second specific embodiment of the present invention. Similar to pixel 150A (discussed above), pixel 150B is arranged with organic dielectric layer 140B disposed on substrate 101, and ferroelectric dielectric layer 130B disposed on organic dielectric layer 140B. Referring to the left side of FIG. 7, organic FET 170B is also similar to organic FET 170A (discussed with reference to FIG. 5) in that it includes a source electrode 172B, a drain electrode 174B and an organic semiconductor portion 176B disposed between organic dielectric material layer 140B and ferroelectric dielectric material layer 130B, and gate electrode 178B is disposed between substrate 101 and organic dielectric material layer 140B below channel region 175B. However, FeFET transistor 160B is formed such that gate electrode 168B is disposed on top of ferroelectric dielectric material layer 130B above channel region 165B, and source electrode 162B, drain electrode 164B and organic semiconductor portion 166B are disposed between organic dielectric material layer 140B and ferroelectric dielectric material layer 130B below drain electrode 168B. This top-gate arrangement provides the advantages of lower contact resistance and encapsulation of environmentally sensitive semiconductors. The top-gate configuration is preferable for both organic FET and FeFET, but bottom-gate organic FET 170B has the advantage of fewer via-processing steps compared to the structure in FIGS. 8 and 9. In order to connect drain electrode 174B with gate electrode 168B, a metal via structure 157B is provided as described above that extends through ferroelectric dielectric material layer 130B between drain electrode 174B and gate electrode 168B.

Figure 8:
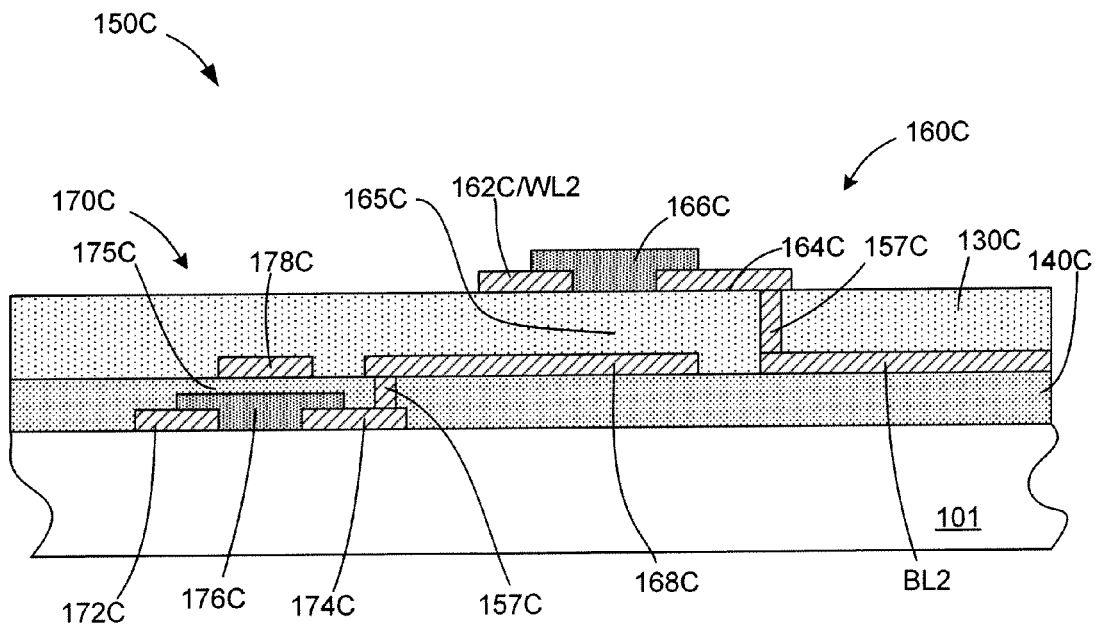
FIG. 8 is a cross-sectional side view showing an exemplary pixel of the organic memory array of FIG. 1 according to another specific embodiment of the present invention.

FIG. 8 is a simplified cross-sectional side view showing a pixel 150C according to another specific embodiment of the present invention including a bottom gate FeFET transistor 160C and a top gate write select (organic FET) transistor 170C, wherein pixel 150C is utilized in place of generalized pixel 150 of FIG. 1 to form an organic memory array according to a third specific embodiment of the present invention. Similar to pixels 150A and 150B (discussed above), pixel 150C is arranged with organic dielectric layer 140C disposed on substrate 101, and ferroelectric dielectric layer 130C disposed on organic dielectric layer 140C. Referring to the left side of FIG. 8, organic FET 170C differs from organic FETs 170A and 170B in that organic FET 170C includes a source electrode 172C, a drain electrode 174C and an organic semiconductor portion 176C disposed between substrate 101 and organic dielectric material layer 140C (i.e., these structures are printed on substrate 101 before dielectric material layer 140C is formed), and gate electrode 178C is disposed between organic dielectric material layer 140C and ferroelectric dielectric material layer 130C above channel region 175C. FeFET transistor 160C is formed such that gate electrode 168C is disposed between organic dielectric material layer 140C and ferroelectric dielectric material layer 130C below channel region 165C, and source electrode 162C, drain electrode 164C and organic semiconductor portion 166C are disposed on top of ferroelectric dielectric material layer 130C below drain electrode 168C. In order to connect drain electrode 174C with gate electrode 168C, a metal via structure 157C is provided as described above that extends through organic dielectric material layer 140C between drain electrode 174C and gate electrode 168C. In addition, in order to facilitate disposing orthogonal signal lines WL2 (which is connected to source electrode 162C) and BL2 (which is connected to drain region 164C), pixel 150C further includes a second metal via structure 158C that extends through ferroelectric dielectric material layer 130C between drain electrode 164C and signal line BL2, which is disposed between organic dielectric material layer 140C and ferroelectric dielectric material layer 130C. An encapsulation layer such as PMMA or parylene can be added over semiconductor 166C to protect the semiconductor from oxidation. The embodiment in FIG. 8 improves the organic FET with the top-gate configuration. The FeFET is left as bottom-gate structure to avoid deposition of semiconductor between the gate electrode 168C and transistors electrodes 162C and 164C, to increase the capacitance in the optional capacitor as indicated in FIG. 2.

Figure 9:
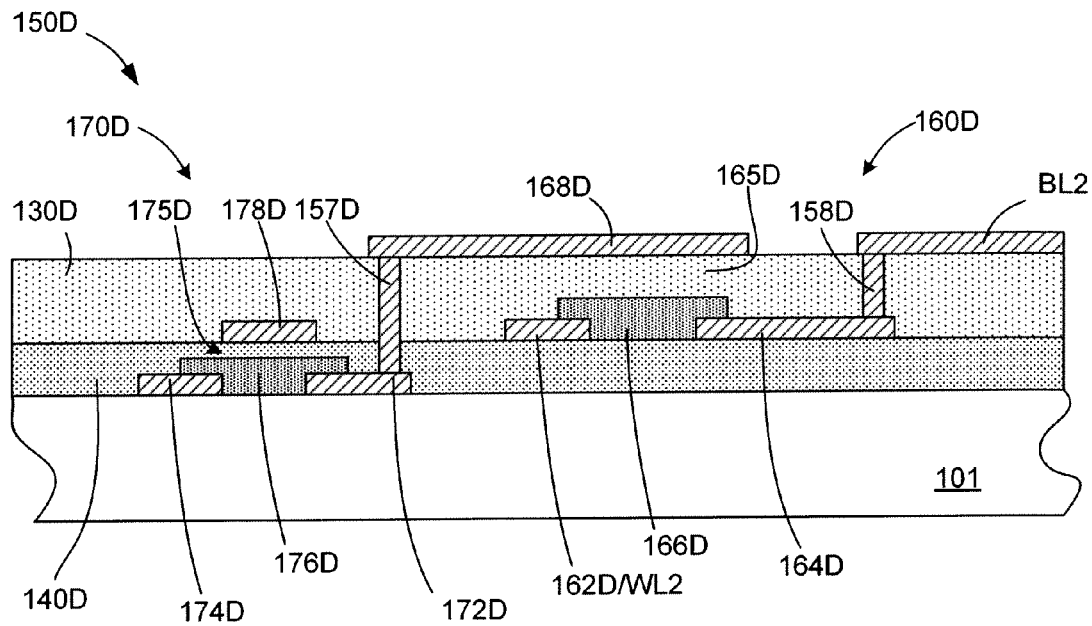
FIG. 9 is a cross-sectional side view showing an exemplary pixel of the organic memory array of FIG. 1 according to another a specific embodiment of the present invention.

FIG. 9 is a simplified cross-sectional side view showing a pixel 150D according to another specific embodiment of the present invention including a top gate FeFET transistor 160D and a top gate write select (organic FET) transistor 170D. Similar to the previous examples, pixel 150D is utilized in place of generalized pixel 150 of FIG. 1 to form an organic memory array according to a fourth specific embodiment of the present invention. In addition, similar to pixels 150A-150C (discussed above), pixel 150D is arranged with organic dielectric layer 140D disposed on substrate 101, and ferroelectric dielectric layer 130D disposed on organic dielectric layer 140D. Referring to the left side of FIG. 9, organic FET 170D is similar to organic FET 150C in that organic FET 170D includes a source electrode 172D, a drain electrode 174D and an organic semiconductor portion 176D disposed between substrate 101 and organic dielectric material layer 140D, and gate electrode 178D is disposed between organic dielectric material layer 140D and ferroelectric dielectric material layer 130D above channel region 175D. However, FeFET transistor 160D is formed such that gate electrode 168D is disposed on top of ferroelectric dielectric material layer 130D above channel region 165D, and source electrode 162D, drain electrode 164D and organic semiconductor portion 166D are disposed between organic dielectric material layer 140D and ferroelectric dielectric material layer 130D below drain electrode 168D. In order to connect drain electrode 174D with gate electrode 168D, a metal via structure 157D is provided as described above that extends through both organic dielectric material layer 140D and ferroelectric dielectric material layer 130D between drain electrode 174D and gate electrode 168D. In addition, in order to facilitate disposing orthogonal signal lines WL2 (which is connected to source electrode 162D) and BL2 (which is connected to drain region 164D), pixel 150D further includes a second metal via structure 158D that extends through ferroelectric dielectric material layer 130D between drain electrode 164D and signal line BL2, which is disposed on ferroelectric dielectric material layer 130D. The embodiment in FIG. 9 improves the contact resistance of both organic FET and FeFET and provides encapsulation for the semiconductors.

Figure 10:
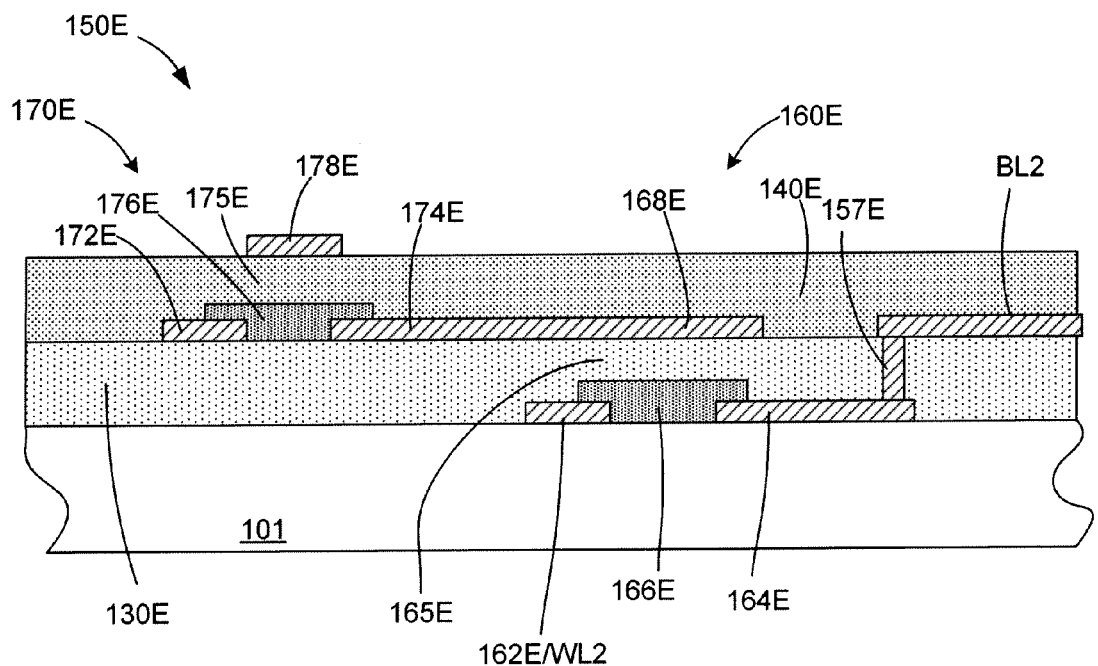
FIG. 10 is a cross-sectional side view showing an exemplary pixel of the organic memory array of FIG. 1 according to another a specific embodiment of the present invention.

FIG. 10 is a simplified cross-sectional side view showing a pixel 150E according to another specific embodiment of the present invention including a top gate FeFET transistor 160E and a top gate write select (organic FET) transistor 170E. Unlike the previous examples, pixel 150E is arranged with ferroelectric dielectric layer 130E disposed on substrate 101, and organic dielectric layer 140E disposed on ferroelectric dielectric layer 130E. Referring to the left side of FIG. 10, organic FET 170E is similar to previous structures in that organic FET 170E includes a source electrode 172E, a drain electrode 174E and an organic semiconductor portion 176E disposed between ferroelectric dielectric layer 130E and organic dielectric material layer 140E, and gate electrode 178E is disposed on top of organic dielectric material layer 140E above channel region 175E. FeFET transistor 160E is formed such that gate electrode 168E is disposed on top of ferroelectric dielectric material layer 130E above channel region 165E, and source electrode 162E, drain electrode 164E and organic semiconductor portion 166E are disposed between substrate 101 and ferroelectric dielectric material layer 130E below drain electrode 168E. In order facilitate disposing orthogonal signal lines WL2 (which is connected to source electrode 162E) and BL2 (which is connected to drain region 164E), pixel 150E further includes a second metal via structure 158E that extends through ferroelectric dielectric material layer 130E between drain electrode 164E and signal line BL2, which is disposed between organic dielectric material layer 140E and ferroelectric dielectric material layer 130E. The embodiment in FIG. 10 improves the contact resistance of both organic FET and FeFET, provides encapsulation for the semiconductors, and reduces the via-processing steps of FIG. 9. The potential disadvantage of this embodiment is that the PVDF-TrFE is deposited early in the process flow and thus requires careful temperature monitoring throughout the fabrication to avoid disturbing the crystallinity of the PVDF-TrFE film. The data in FIG. 4 demonstrates that this potential difficulty with film crystallinity has been overcome.

As set forth above, a second solution to the problem associated with the use of FeFETs (i.e., that a common dataline cannot be used to transmit the $I_{FeFET}$ because the read-out will be a sum of the current from several FeFETs rather than from a single pixel) involves adding a "read switch (i.e., a second organic thin-film FET) to each pixel that serves to isolate each pixel's FeFET current during read-out operations of other pixels connected to the common dataline. Such three-transistor (3T) pixels are described below with reference to FIGS. 11-14.

Figure 11:
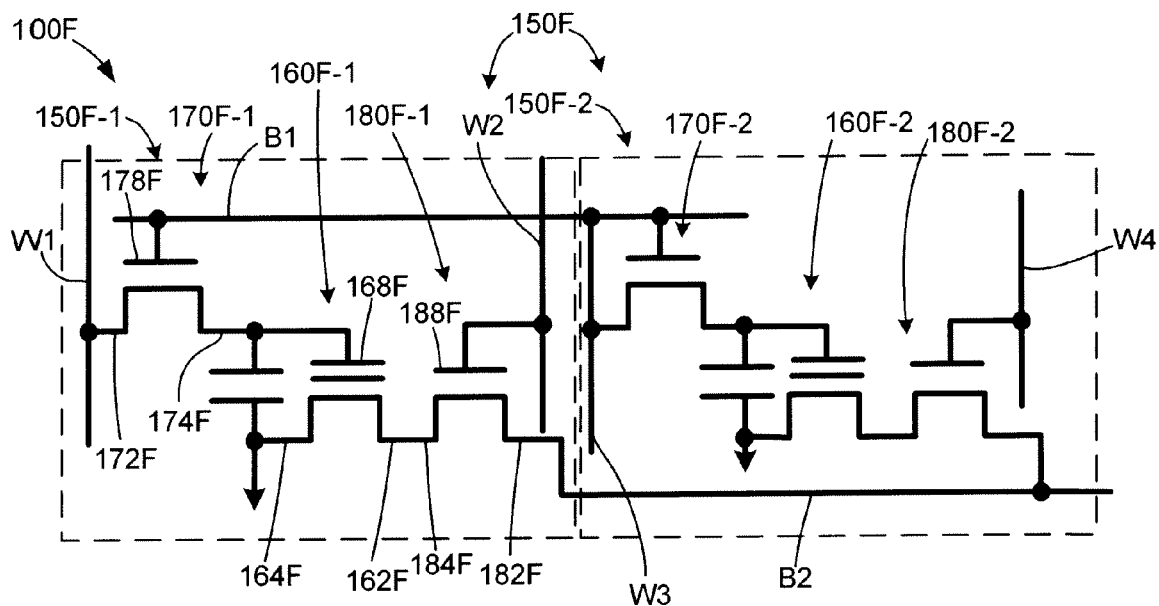
FIG. 11 is simplified circuit diagram showing an organic memory array utilizing pixels having three FETs according to another embodiment of the present invention.

FIG. 11 is a simplified diagram depicting a portion of a generalized organic memory array 100F that is formed in accordance with another embodiment of the present invention, where memory array 100F includes multiple 3T memory pixels 150F and associated control and interconnect structures that are formed in the manner described above. In particular, FIG. 11 shows 3T memory pixels 150F-1 and 150F-2 that are disposed adjacent to each other in a row of memory array 100F. Other pixels of array 100F are omitted for brevity, but are essentially identical to pixels 150F-1 and 150F-2. According to an aspect of the present embodiment, each pixel 150F of memory array 100F includes a FeFET, a "write" (first) organic FET, and a "read" (second) organic FET that are connected to associated signal lines of array 100F. For example, pixel 150F-1 includes an FeFET 160F-1 connected between a "write" (first) organic FET 170F-1 and a "read" (second) organic FET 180F-1, and pixel 150F-1 includes an FeFET 160F-1 connected between a "write" (first) organic FET 170F-1 and a "read" (second) organic FET 180F-1.

Similar to the 2T embodiments described above, the "write" transistor of each pixel 150F is disposed to pass a write pulse signal to the gate terminal of the pixel's FeFET during write operations. For example, referring to pixel 150F-1, organic FET 170F-1 includes a source electrode 172F connected to signal line W1, a drain electrode 174F connected to a gate terminal 168F of FeFET 160F, and a gate electrode 178F connected to a signal line B1. Similarly, organic FET 170F-2 of pixel 150F-2 is connected to signal lines W2 and B1. Write operations performed in memory array 100F are therefore similar to those described above, with write operations involving turning on a selected "write" FET by passing a high voltage on associated signal lines (e.g., applying a high voltage on signal line B1 to turn on organic FET 170F-1), and passing associated write pulse signals along associated signal lines the gate terminals of addressed FeFETs (e.g., passing a write pulse signal along signal line W1, which is passed by "turned on" organic FET 170F-1 to gate terminal 168F of FeFET 160F-1).

Figure 12:
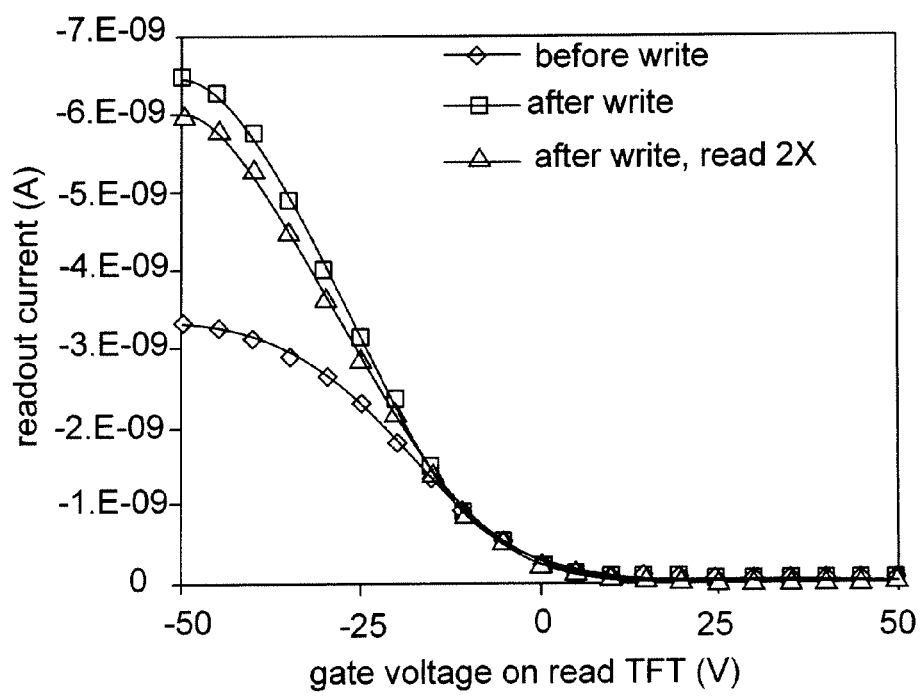
FIG. 12 is a simplified graph showing source-drain current versus read transistor voltage comparisons associated with Fe-FET memory cells utilized in the organic memory array of FIG. 1.

Read operations are also performed in a manner similar to the previous embodiments, with the polarized (i.e., "up" or "down") state of each FeFET being determined by transmitting a read current signal and measuring the source-drain current passed through the FeFET of a selected pixel. However, because signal lines are shared by pixels 150F disposed along each row array 100F (e.g., pixels 150F-1 and 150F-2 share dataline B2), in the absence of the read FETs, a read current passed along a given signal line (e.g., signal line B2) would simultaneously through the FeFETs of all pixels 150F associated with that row (e.g., the signal would pass through both FeFETs 160F-1 and 160F-2), and would thereby produce a sum of currents from a whole row of FeFETs rather than from a single pixel. Further, a gate voltage cannot be applied to turn off the FeFETs of non-selected pixels because, as explained above, applying a gate signal to an FeFET will over-write its stored state. The solution for avoiding the isolation problem in array 100F is to add a "read" FET to each pixel 150F (e.g., organic FET 180F-1 is provided in pixel 150F-1, and organic FET 180F-2 is provided in pixel 150F-2) in order to isolate each pixel's FeFET current for read-out. The "read" FET of each pixel 150F is connected between the shared signal line and the source terminal of that pixel. For example, organic FET 180F-1 includes a (third) source electrode 182F electrically connected to signal line B2, a (third) drain electrode 184F connected to drain electrode 162F, a third gate terminal 186F connected to an associated signal line W2. Organic FET 180F-2 is similarly arranged and connected to signal lines B2 and W4. Organic FETs 180F-1 and 180F-2 also include an organic semiconductor portion disposed in a channel region defined between the source and drain electrodes in a manner similar to that described above. With this arrangement, a read current passed along signal line B2 is only passed through "selected" FeFET 160-1 if signal line W2 carries a voltage sufficient to turn on "read" FET 180F-1 (i.e., with signal line W4 maintained at a low voltage to prevent the read current from passing through "read" FET 180F-2). Experimentally derived characteristics associated with 3T pixels 150F are shown in FIG. 12.

Figure 13:
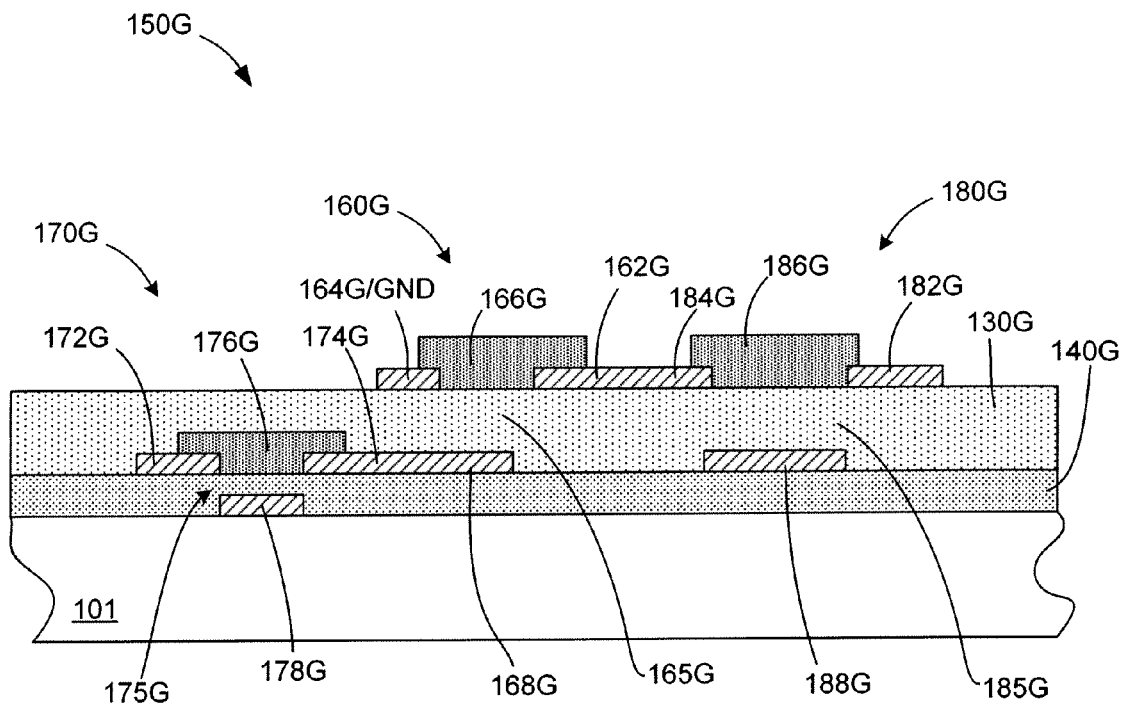
FIG. 13 is a cross-sectional side view showing an exemplary pixel of the organic memory array of FIG. 11 according to another a specific embodiment of the present invention.

FIG. 13 is a simplified cross-sectional side view showing a 3T pixel 150G according to another specific embodiment of the present invention. Pixel 150G is arranged with a ferroelectric dielectric layer 130G disposed on substrate 101, and organic dielectric layer 140G disposed on ferroelectric dielectric layer 130G. Pixel 150G includes a FeFET transistor 160G, a "read" (first) organic FET 170G, and a "write" organic FET 180G. Organic FET 170G includes a source electrode 172G, a drain electrode 174G and an organic semiconductor portion 176G disposed between ferroelectric dielectric layer 130G and organic dielectric material layer 140G, and a gate electrode 178G is disposed on top of substrate 101 below channel region 175G. FeFET transistor 160G includes a source electrode 162G, a drain electrode 164G and an organic semiconductor portion 166G disposed on top of ferroelectric dielectric material layer 130G, and a gate electrode 168G disposed on top of organic dielectric material layer 140G below channel region 165G. Organic FET 180G includes a source electrode 182G, a drain electrode 184G and an organic semiconductor portion 186G disposed on top of ferroelectric dielectric material layer 130G, and a gate electrode 188G disposed on top of organic dielectric material layer 140G below channel region 185G. Drain electrode 184G connects to source electrode 162G to facilitate read operations in the manner described above. Note that organic FET 180G utilizes a portion of ferroelectric dielectric material layer 130G to for channel region 185G, thus utilizing the ferroelectric dielectric material as a "common" dielectric material. This embodiment ensures that pixel crosstalk is eliminated during the data read-out process compared to 2T pixel in FIG. 2. This configuration has the advantage of fewer processing steps compared to the embodiment in FIG. 14.

Figure 14:
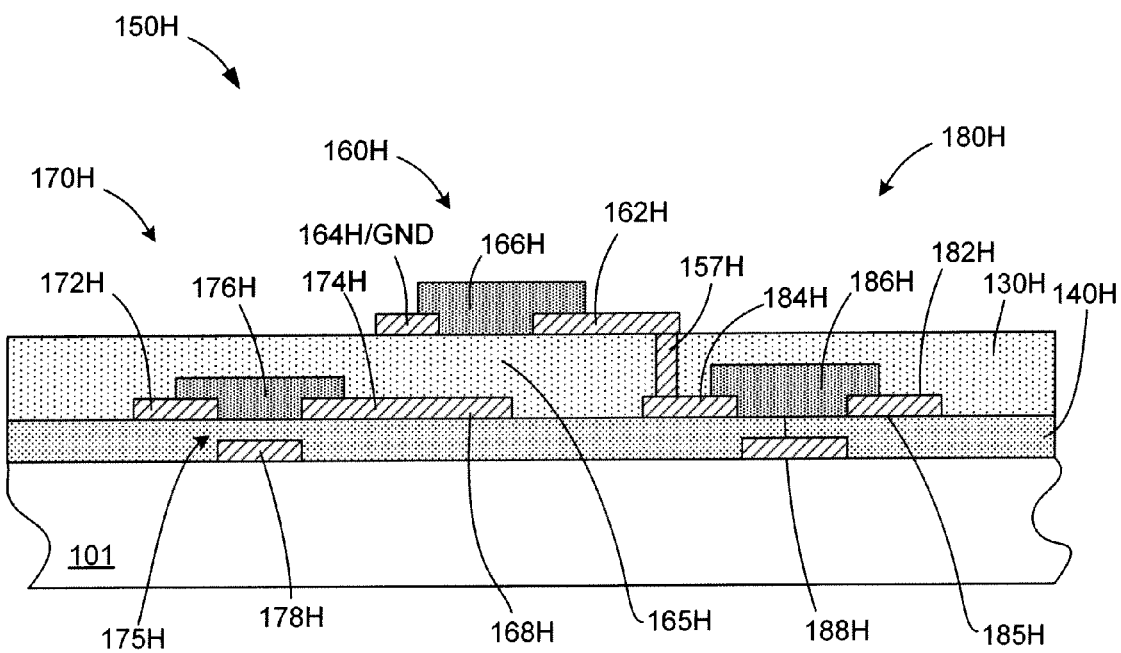
FIG. 14 is a cross-sectional side view showing an exemplary pixel of the organic memory array of FIG. 11 according to another a specific embodiment of the present invention.

FIG. 14 is a simplified cross-sectional side view showing a 3T pixel 150H according to another specific embodiment of the present invention. Similar to pixel 150G, pixel 150H is arranged with a ferroelectric dielectric layer 130H disposed on substrate 101, and organic dielectric layer 140H disposed on ferroelectric dielectric layer 130H. Pixel 150H also includes a bottom gate FeFET transistor 160H, a bottom gate "read" FET 170H, and a "write" FET 180H. Organic FET 170H includes a source electrode 172H, a drain electrode 174H and an organic semiconductor portion 176H disposed between ferroelectric dielectric layer 130H and organic dielectric material layer 140H, and a gate electrode 178H is disposed on top of substrate 101 below channel region 175H. FeFET transistor 160H includes a source electrode 162H, a drain electrode 164H and an organic semiconductor portion 166H disposed on top of ferroelectric dielectric material layer 130H, and a gate electrode 168H disposed on top of organic dielectric material layer 140H below channel region 165H. Organic FET 180H includes a source electrode 182H, a drain electrode 184H and an organic semiconductor portion 186H disposed on top of ferroelectric dielectric material layer 130H, and a gate electrode 188H disposed on top of organic dielectric material layer 140H below channel region 185H. A metal via structure 157H extends through ferroelectric dielectric material layer 130H between drain electrode 184H and source electrode 162H to facilitate read operations in the manner described above. This embodiment allow the "read" FET 180H to use the dielectric 140H that makes a better interface with the semiconductor than 130H for the organic FET. This has the advantage of better "read" FET performance over FIG. 13, at the expense of more processing steps.

Figure 15A:
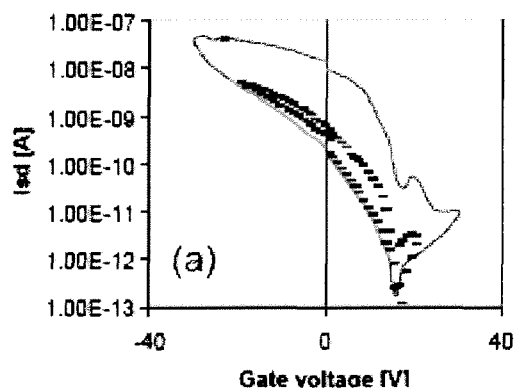
FIGS. 15(A), 15(B) and 15(C) are graphs showing voltage characteristics associated with utilizing the pixels mentioned above to store analog data signals according to anther embodiment of the present invention.
Figure 15B:
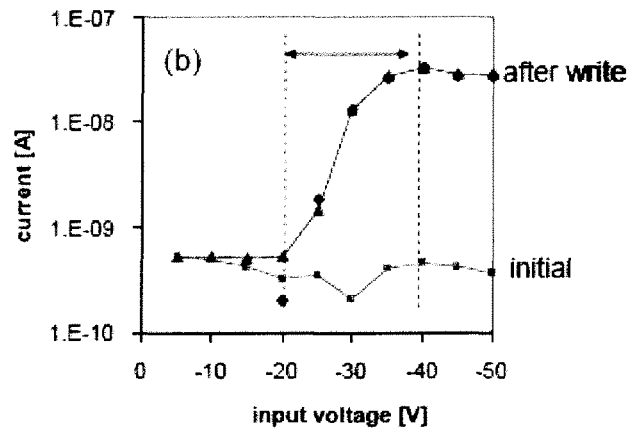
Figure 15C:
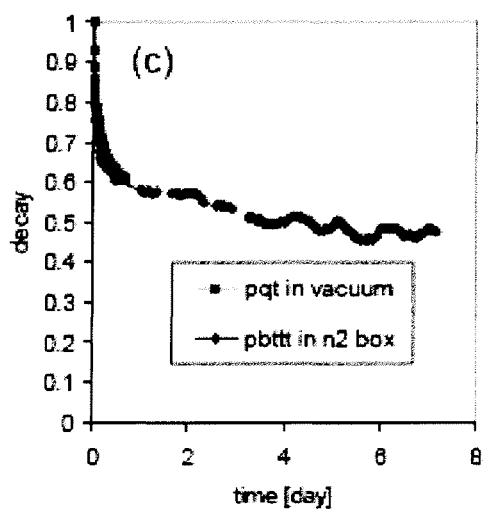

According to another aspect of the present invention, the various organic memory array structures disclosed above use FeFETs as analog memory without analog-to-digital circuits to store different values of input voltage. FIGS. 15(A) to 15(C) are graphs illustrating that the magnitude of an input signal voltage affects the extent to which the dielectric polarization is switched, thus allowing the storage and readback of analog data by measuring the source-drain current, which is dependent on the input voltage. FIG. 15(A) shows that the difference in "on" and "off" currents in the FeFETs of the present invention depends on the input gate voltage. FIG. 15(B) shows the read-out current of the FeFETs as a function of input voltage, and in particular shows the current increased by 28 nA/20V=1.4 nA/V. FIG. 15(C) shows calibration for the signal decay with time; despite using two different semiconductors, the decay is similar in magnitude. Thus, decay in source-drain current is observed with time, and calibration of this decay is necessary if the FeFET is used in analog mode.

Figure 16A:
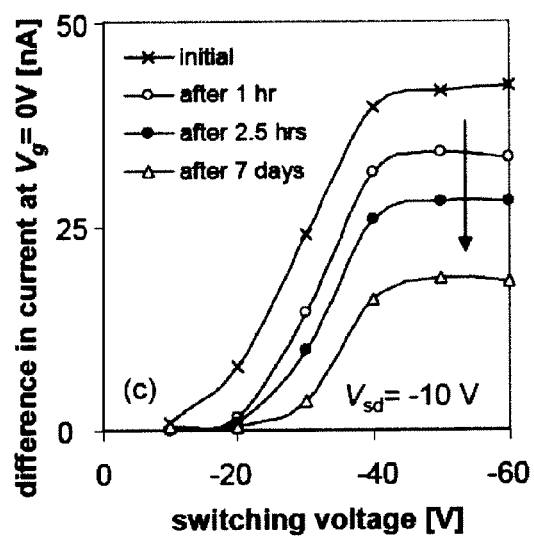
FIGS. 16(A) and 16(B) are graphs depicting a calibration technique associated with utilizing the pixels mentioned above to store analog data signals according to anther embodiment of the present invention.
Figure 16B:
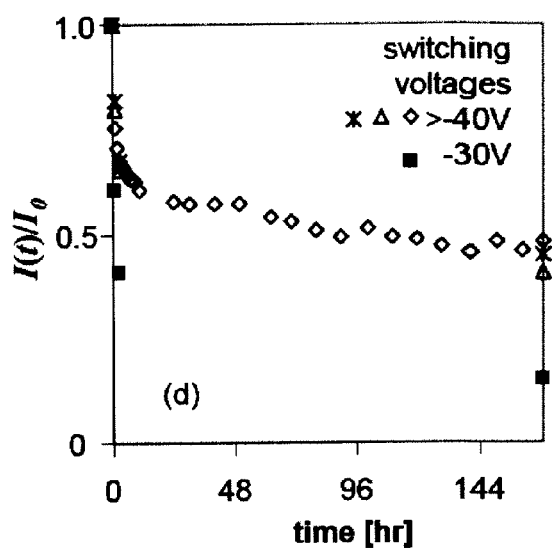

When using the ferroelectric transistor as analog memory, hysteresis decay will occur and a calibration scheme is needed to extract the original input voltage. The calibration is done by sweeping gate voltages with increasing range (shown in FIG. 15(A), and the resulting difference in current hysteresis can be plotted against the switching voltage (shown in FIG. 15(B), here defined as the highest voltage applied in the gate-voltage sweep. The change in current with time can be traced by this calibration method, as shown in FIGS. 15(C), 16(A) and 16(B).

Although the present invention has been described with respect to certain specific embodiments, it will be clear to those skilled in the art that the inventive features of the present invention are applicable to other embodiments as well, all of which are intended to fall within the scope of the present invention.

The invention claimed is:
1. An organic memory array comprising:
   a substrate;
   a first dielectric layer disposed over the substrate and a second dielectric layer disposed over the first dielectric layer, wherein one of said first and second dielectric layers consists of a ferroelectric dielectric material having opposing first and second surfaces, and the other of said first and second dielectric layers consists of an organic dielectric material having opposing first and second surfaces;

a plurality of pixels, each of said plurality of pixels including:

a ferroelectric field effect transistor (FeFET) including a first source electrode, a first drain electrode, and a first organic semiconductor portion, disposed in a first channel region separating said first source electrode and said first drain electrode, wherein said first source electrode, said first drain electrode, and said first organic semiconductor portion are disposed on said first surface of said ferroelectric dielectric material layer, said ferroelectric field effect transistor further including a first gate electrode disposed on said second surface of said ferroelectric dielectric material layer and positioned opposite to said first channel region; and a thin-film organic field effect transistor (FET) including a second source electrode, a second drain electrode, and a second organic semiconductor portion disposed in a second channel region separating said second source electrode and said second drain electrode, wherein said second source electrode, said second drain electrode, and said second organic semiconductor portion are disposed on said first surface of said organic dielectric material layer, said organic FET further including a second gate electrode disposed on said second surface of said organic dielectric material layer and positioned opposite to said second channel region, and wherein said second source electrode is electrically connected to the first gate electrode of said ferroelectric field effect transistor; and means for applying a write select signal to the second gate electrode of a selected pixel of said plurality of pixels and a write pulse signal to the second source electrode of said selected pixel such that said first write select signal turns on the organic FET of said selected pixel to pass the write pulse signal to the first gate electrode of said selected pixel, whereby an electric field generated by said first gate electrode in response to said write pulse signal portion generates a corresponding polarization of a portion of said ferroelectric dielectric material layer disposed between the first gate electrode and the first channel region of said selected pixel.

2. The organic memory array according to claim 1, further comprising a plurality of signal lines disposed on one of said substrate, said first dielectric layer and said second dielectric layer, wherein a first signal line is connected to the first source electrode of a selected pixel of said plurality of pixels, a second signal line is connected to the first drain electrode of said selected pixel, a third signal line is connected to the second source electrode of said selected pixel, and a fourth signal line is connected to the second gate electrode of said selected pixel.

3. The organic memory array according to claim 2, wherein said plurality of signal lines comprise parallel word lines and parallel bit lines that are aligned orthogonal to the parallel word lines, wherein the first and fourth signal lines comprise two of said parallel word lines, and said second and third signal lines comprise two of said parallel bit lines.

4. The organic memory array according to claim 1, further comprising means for applying a read current to the first source electrode of said selected pixel and coupling the first drain electrode of said selected pixel to a current detection circuit, whereby an amount of said read current is passed by said ferroelectric field effect transistor of said selected pixel to said current detection circuit.

5. The organic memory array according to claim 1, wherein said organic dielectric material layer is disposed between said substrate and said ferroelectric dielectric material layer.

6. The organic memory array according to claim 5, wherein said second source electrode, said second drain electrode and said second organic semiconductor portion of each pixel of said plurality of pixels are disposed between said organic dielectric material layer and said ferroelectric dielectric material layer, and said second gate electrode of said each pixel is disposed between the substrate and said organic dielectric material layer.

7. The organic memory array according to claim 6, wherein said first gate electrode of said each pixel is disposed between the organic dielectric material layer and said ferroelectric dielectric material layer, and said first source electrode, said first drain electrode and first organic semiconductor portion of said each pixel are disposed on said ferroelectric dielectric material layer over the first drain electrode of said each pixel.

8. The organic memory array according to claim 7, wherein said each pixel further comprises a metal via structure extending through said ferroelectric dielectric material layer between said first drain electrode and an associated signal line disposed between the organic dielectric material layer and said ferroelectric dielectric material layer.

9. The organic memory array according to claim 6,
wherein said first source electrode, said first drain electrode and first organic semiconductor portion of said each pixel are disposed between the organic dielectric material layer and said ferroelectric dielectric material layer, and said first gate electrode of said each pixel is disposed on said ferroelectric dielectric material layer over said first channel region of said each pixel, and
wherein said each pixel further comprises a metal via structure extending through said ferroelectric dielectric material layer between said second drain electrode and said first gate electrode.

10. The organic memory array according to claim 5, wherein said second source electrode, said second drain electrode and said second organic semiconductor portion of each pixel of said plurality of pixels are disposed between said substrate and said organic dielectric material layer, and said second gate electrode of said each pixel is disposed between said organic dielectric material layer and said ferroelectric dielectric material layer.

11. The organic memory array according to claim 10, wherein said first gate electrode of said each pixel is disposed between the organic dielectric material layer and said ferroelectric dielectric material layer, and said first source electrode, said first drain electrode and first organic semiconductor portion of said each pixel are disposed on said ferroelectric dielectric material layer over the first drain electrode of said each pixel.

12. The organic memory array according to claim 11, wherein said each pixel further comprises a metal via structure extending through said ferroelectric dielectric material layer between said first drain electrode and an associated signal line disposed between the organic dielectric material layer and said ferroelectric dielectric material layer.

13. The organic memory array according to claim 10,
wherein said first source electrode, said first drain electrode and first organic semiconductor portion of said each pixel are disposed between the organic dielectric material layer and said ferroelectric dielectric material layer, and said first gate electrode of said each pixel is disposed on said ferroelectric dielectric material layer over said first channel region of said each pixel, and wherein said each pixel further comprises a metal via structure extending through said ferroelectric dielectric material layer between said second drain electrode and said first gate electrode.

14. An organic memory array comprising:

a substrate;

a first dielectric layer disposed over the substrate and a second dielectric layer disposed over the first dielectric layer, wherein one of said first and second dielectric layers consists of a ferroelectric dielectric material having opposing first and second surfaces, and the other of said first and second dielectric layers consists of an organic dielectric material having opposing first and second surfaces;

a plurality of pixels, each of said plurality of pixels including:

a ferroelectric field effect transistor (FeFET) including a first source electrode, a first drain electrode, and a first organic semiconductor portion, disposed in a first channel region separating said first source electrode and said first drain electrode, wherein said first source electrode, said first drain electrode, and said first organic semiconductor portion are disposed on said first surface of said ferroelectric dielectric material layer, said ferroelectric field effect transistor further including a first gate electrode disposed on said second surface of said ferroelectric dielectric material layer and positioned opposite to said first channel region; and a thin-film organic field effect transistor (FET) including a second source electrode, a second drain electrode, and a second organic semiconductor portion disposed in a second channel region separating said second source electrode and said second drain electrode, wherein said second source electrode, said second drain electrode, and said second organic semiconductor portion are disposed on said first surface of said organic dielectric material layer, said organic FET further including a second gate electrode disposed on said second surface of said organic dielectric material layer and positioned opposite to said second channel region, and wherein said second source electrode is electrically connected to the first gate electrode of said ferroelectric field effect transistor, wherein said ferroelectric dielectric material layer is disposed between said substrate and said organic dielectric material layer, wherein said second source electrode, said second drain electrode and said second organic semiconductor portion of each pixel of said plurality of pixels are disposed between said ferroelectric dielectric material layer and said organic dielectric material layer, and said second gate electrode of said each pixel is disposed on said organic dielectric material layer over said second channel region, and wherein said first source electrode, said first drain electrode and first organic semiconductor portion of said each pixel are disposed between the substrate and said ferroelectric dielectric material layer, and said first gate electrode of said each pixel is between said ferroelectric dielectric material layer and said organic dielectric material layer and positioned over said first channel region of said each pixel.

15. The organic memory array according to claim 14, wherein said each pixel further comprises a metal via structure extending through said ferroelectric dielectric material layer between said first drain electrode and an associated signal line disposed between the organic dielectric material layer and said ferroelectric dielectric material layer.

16. An organic memory array comprising:

a substrate;

a first dielectric layer disposed over the substrate and a second dielectric layer disposed over the first dielectric layer, wherein one of said first and second dielectric layers consists of a ferroelectric dielectric material having opposing first and second surfaces, and the other of said first and second dielectric layers consists of an organic dielectric material having opposing first and second surfaces;

a plurality of pixels, each of said plurality of pixels including:

a ferroelectric field effect transistor (FeFET) including a first source electrode, a first drain electrode, and a first organic semiconductor portion, disposed in a first channel region separating said first source electrode and said first drain electrode, wherein said first source electrode, said first drain electrode, and said first organic semiconductor portion are disposed on said first surface of said ferroelectric dielectric material layer, said ferroelectric field effect transistor further including a first gate electrode disposed on said second surface of said ferroelectric dielectric material layer and positioned opposite to said first channel region; and a thin-film organic field effect transistor (FET) including a second source electrode, a second drain electrode, and a second organic semiconductor portion disposed in a second channel region separating said second source electrode and said second drain electrode, wherein said second source electrode, said second drain electrode, and said second organic semiconductor portion are disposed on said first surface of said organic dielectric material layer, said organic FET further including a second gate electrode disposed on said second surface of said organic dielectric material layer and positioned opposite to said second channel region, and wherein said second source electrode is electrically connected to the first gate electrode of said ferroelectric field effect transistor, wherein each of said plurality of pixels further comprises a read field effect transistor including a third source electrode electrically connected to an associated first row signal line, a third drain electrode connected to the first drain electrode, a third organic semiconductor portion disposed in a third channel region separating said third source electrode and said third drain electrode, and a third gate terminal connected to an associated second row signal line.

17. The organic memory array according to claim 16, wherein said third source electrode, said third drain electrode, and said third organic semiconductor portion are disposed on said first surface of said ferroelectric dielectric material layer, and said third gate electrode is disposed on said second surface of said ferroelectric dielectric material layer and positioned opposite to said third channel region.

18. The organic memory array according to claim 16, wherein said third source electrode, said third drain electrode, and said third organic semiconductor portion are disposed on said first surface of said organic dielectric material layer, said third gate electrode is disposed on said second surface of said organic dielectric material layer and positioned opposite to said third channel region, and wherein said each of said plurality of pixels further comprises a metal via structure extending through said ferroelectric dielectric material layer between said first source electrode and said third drain electrode.

19. An organic memory array comprising:
  a substrate;
  a first dielectric layer disposed over the substrate and a second dielectric layer disposed over the first dielectric layer, wherein one of said first and second dielectric layers consists of a ferroelectric dielectric material having opposing first and second surfaces, and the other of said first and second dielectric layers consists of an organic dielectric material having opposing first and second surfaces;
  a plurality of pixels, each of said plurality of pixels including:
    a ferroelectric field effect transistor (FeFET) including a first source electrode, a first drain electrode, and a first organic semiconductor portion, disposed in a first channel region separating said first source electrode and said first drain electrode, wherein said first source electrode, said first drain electrode, and said first organic semiconductor portion are disposed on said first surface of said ferroelectric dielectric material layer, said ferroelectric field effect transistor further including a first gate electrode disposed on said second surface of said ferroelectric dielectric material layer and positioned opposite to said first channel region; and
    a thin-film organic field effect transistor (FET) including a second source electrode, a second drain electrode, and a second organic semiconductor portion disposed in a second channel region separating said second source electrode and said second drain electrode, wherein said second source electrode, said second drain electrode, and said second organic semiconductor portion are disposed on said first surface of said organic dielectric material layer, said organic FET further including a second gate electrode disposed on said second surface of said organic dielectric material layer and positioned opposite to said second channel region, and wherein said second source electrode is electrically connected to the first gate electrode of said ferroelectric field effect transistor; and
  means for writing analog data to said FeFET of each of said plurality of pixels, and for reading analog data from said FeFET of each of said plurality of pixels.

* * * * *